US009153618B2

(12) United States Patent
Miyamoto et al.

(10) Patent No.: US 9,153,618 B2
(45) Date of Patent: Oct. 6, 2015

(54) PHOTOELECTRIC CONVERSION APPARATUS, IMAGING APPARATUS USING THE SAME, AND MANUFACTURING METHOD THEREOF

(71) Applicant: MITSUBISHI ELECTRIC CORPORATION, Tokyo (JP)

(72) Inventors: Kenichi Miyamoto, Kumamoto (JP);
Masami Hayashi, Kumamoto (JP);
Hideki Noguchi, Kumamoto (JP);
Katsuaki Murakami, Kumamoto (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 14/302,268

(22) Filed: Jun. 11, 2014

(65) Prior Publication Data
US 2014/0291743 A1 Oct. 2, 2014

Related U.S. Application Data

(62) Division of application No. 13/707,537, filed on Dec. 6, 2012, now Pat. No. 8,828,808.

(30) Foreign Application Priority Data

Dec. 26, 2011 (JP) .................. 2011-283787

(51) Int. Cl.
*H01L 27/146* (2006.01)
*H01L 29/66* (2006.01)

(52) U.S. Cl.
CPC .... *H01L 27/14636* (2013.01); *H01L 27/14612* (2013.01); *H01L 27/14658* (2013.01); *H01L 29/6675* (2013.01); *H01L 27/14683* (2013.01)

(58) Field of Classification Search
None
See application file for complete search history.

(56) References Cited

U.S. PATENT DOCUMENTS

| 5,976,978 A | 11/1999 | Salisbury |
| 7,499,122 B2 | 3/2009 | Lai et al. |

(Continued)

FOREIGN PATENT DOCUMENTS

| JP | 2001-015514 A | 1/2001 |
| JP | 2002-009272 A | 1/2002 |

(Continued)

OTHER PUBLICATIONS

S.Kasap et al.; "Amorphous and Polycrystalline Photoconductors for Direct Conversion Flat Panel X-Ray Image Sensors"; Senors 2011, 11, 5112-5157; www.mdpi.com/journal/sensors.
Y. Liu; "Automatic Defect Detection for TFT-LCD Array Process Using Quasiconformal Kernel Support Vector Data Description"; International Journal of Molecular Sciences 12.9 (2011): 5762-781; www.mdpi.com/journal/ijms.

*Primary Examiner* — Joseph Schoenholtz
(74) *Attorney, Agent, or Firm* — Studebaker & Brackett PC

(57) ABSTRACT

A photoelectric conversion apparatus includes: an active matrix-type TFT array substrate on which photoelectric conversion elements and thin film transistors are arranged in a matrix shape, wherein the photoelectric conversion element connects with a drain electrode via a contact hole opened through a first interlayer insulation film provided above the thin film transistor, wherein a data line and a bias line are connected with the source electrode and the photoelectric conversion element via respective contact holes opened through the second interlayer insulation, and wherein at least a part of the photoelectric conversion element is fixed to have a shape different from a normal pixel between pixels adjacent to each other in an extending direction of the gate line, and an electrical connection between the photoelectric conversion element and the data line is cut off in the transistor of the pixel having the different shape.

13 Claims, 31 Drawing Sheets

(56) References Cited

U.S. PATENT DOCUMENTS

| | | |
|---|---|---|
| 8,262,427 B2 | 9/2012 | Oka et al. |
| 2004/0159794 A1 | 8/2004 | Morii et al. |
| 2005/0221208 A1 | 10/2005 | Murakami |
| 2006/0035391 A1 | 2/2006 | Sugine |
| 2006/0091390 A1 | 5/2006 | Morii et al. |
| 2007/0176216 A1 | 8/2007 | Watanabe et al. |
| 2008/0116501 A1 | 5/2008 | Lin et al. |
| 2009/0075405 A1 | 3/2009 | Watanabe et al. |
| 2011/0114846 A1 | 5/2011 | Mochizuki et al. |
| 2011/0127593 A1* | 6/2011 | Hayashi ......................... 257/292 |
| 2011/0180889 A1* | 7/2011 | Jung et al. ..................... 257/428 |

FOREIGN PATENT DOCUMENTS

| | | |
|---|---|---|
| JP | 2004-179645 A | 6/2004 |
| JP | 2005-302751 A | 10/2005 |
| JP | 2006-053405 A | 2/2006 |
| JP | 2007-201365 A | 8/2007 |
| JP | 2008-251609 A | 10/2008 |
| JP | 2011-019591 A | 2/2011 |

* cited by examiner (a)

(b)

(a)

(b)

(a)

(b)

(a)

(b)

(a)

REPAIR PART A (b)

(a)

(b)

(a)

(b)

(a)

(b)

(a)

(b)

(a)

REPAIR PART A (b)

(a)

(b)

(a)

(b)

(a)

(b)

(a)

REPAIR PART A (b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

PHOTOELECTRIC CONVERSION APPARATUS, IMAGING APPARATUS USING THE SAME, AND MANUFACTURING METHOD THEREOF

CROSS-REFERENCE TO RELATED APPLICATION

This application claims priority from Japanese Patent Application No. 2011-283787 filed on Dec. 26, 2011, the entire subject matter of which is incorporated herein by reference.

TECHNICAL FIELD

This disclosure relates to a photoelectric conversion apparatus that mainly converts radiation into an electric signal and a radiographic imaging apparatus having the same.

BACKGROUND

In many cases, an X-ray inspection machine used in a medical field converts an X-ray into a visible light and the like by a fluorescent plate and sensitizes a film that is closely contacted to the fluorescent plate, because it is necessary to correctly detect an abnormal part of a patient. According to a method adopted in the X-ray inspection machine, there is no problem as regards a resolution of an image at a practical level. However, it takes time from measurement to diagnosis. Also, when specifying a measuring place, it depends on a skill and a sense of an X-ray technician in many areas.

In recent years, a large scale area sensor represented by amorphous silicon and the like has been developed to increase the reliability thereof. Also, the developments for performing the X-ray inspection in real time and using an emphasis image to thus increase an efficiency of abnormal diagnosis have been actively made, considering the merit of using the amorphous silicon and the easy large-sizing.

An array substrate of the large scale area sensor used in a radiographic imaging apparatus has a configuration where pixels having switching elements such as thin film transistors and photoelectric conversion elements such as photodiodes are arranged two-dimensionally. In addition to this, the array substrate has gate lines that supply a voltage to the switching elements and bias lines for reading photovoltaic power of the photoelectric conversion elements. The switching element is provided at an intersection point of the gate line and the data line and the bias line is provided to intersect the pixel that is defined by the intersection of the gate line and the data line.

By using the above array substrate, when preparing an image using detected electric signals, correction values of the signals for the respective pixels are provided, so that an even image can be obtained. Also, it is possible to correct a defect pixel by image processing. A cluster defect such as line defect becomes a defect, in that it cannot be corrected. Also, when an electric characteristic is changed as regards a correction value, the right correction cannot be made, so that the line defect is recognized as a point defect.

As technologies for repairing the defects, a method of cutting an electrode or wiring with laser light or method of cutting a resist pattern has been known (refer to JP-A-2004-179645, JP-A-2005-302751, JP-A-2007-201365 and JP-A-2006-53405). Also, a technology of performing image processing has been known in which when a pixel having a defect that cannot be repaired remains, a defect pixel is stored in advance in a system of a radiographic imaging apparatus and an image of the stored defect pixel is interpolated with an output of surrounding pixels (refer to JP-A-2002-9272 (page 3) and JP-A-2011-19591).

SUMMARY

When the line defect of the array substrate is made to be a point defect by the repair using the laser and the like, a photodiode or thin film transistor may be damaged by the laser energy and the like upon the repair. The damaged element may exhibit a large change in characteristics for a long-time operation, even though an initial operation thereof is normal.

This disclosure provides at least a photoelectric conversion apparatus capable of preventing a point defect from occurring for a longtime operation when a line defect as described above is repaired. This disclosure also provides a method of manufacturing the photoelectric conversion apparatus in which a point defect does not occur for a longtime operation.

According to this disclosure, an electrical connection between a switching element and a photodiode or a data line and a switching element of a pixel having a part at which a line defect is repaired is disconnected, the corresponding pixel is registered in advance as a non-charged defect pixel and image processing is performed.

It is possible to prevent a photodiode of a damaged pixel from being deteriorated and thus becoming an uncorrectable defect pixel, so that it is possible to provide a high-quality photoelectric conversion apparatus.

BRIEF DESCRIPTION OF THE DRAWINGS

The foregoing and additional features and characteristics of this disclosure will become more apparent from the following detailed descriptions considered with the reference to the accompanying drawings, wherein.

DETAILED DESCRIPTION

First Illustrative Embodiment

Figure 33A:
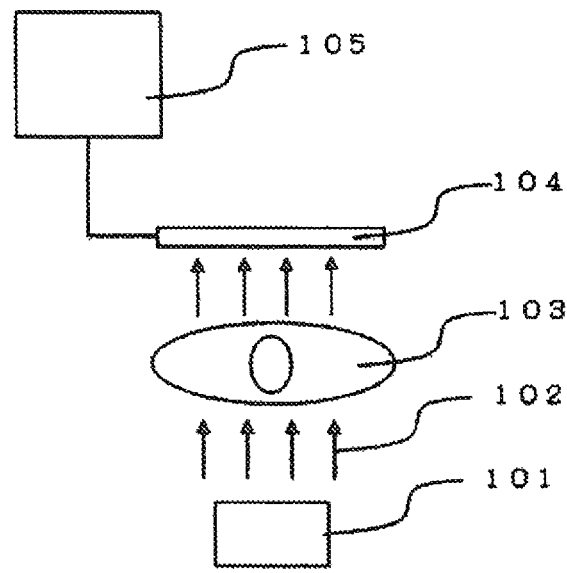
FIGS. 33A and 33B show a configuration of a radiographic imaging apparatus and a photoelectric conversion apparatus.

Hereinafter, preferred illustrative embodiments of this disclosure will be described. FIG. 33A shows a configuration of a radiographic imaging apparatus using a photoelectric conversion apparatus according to a first illustrative embodiment. An X-ray 102 emitted from an X-ray source 101 penetrates the human body 103, which is a subject for photography, with a transmissivity relating to a tissue in the human body, and is then illuminated to a photoelectric conversion apparatus 104. The photoelectric conversion apparatus 104 converts the illuminated X-ray into fluorescence directly or with a scintillator and the like and illuminates the fluorescence to an array substrate 1 to thus convert the X-ray 102 into an electric signal. The obtained electric signal is transmitted to an image processing apparatus 105 in which the signal is processed by image processing for obtaining an image reflecting the transmissivity relating to the tissue in the human body 103 and an image is thus displayed.

In the image processing apparatus 105, addresses of defect pixels and pixel signal correction coefficients in accordance with each individual of the photoelectric conversion apparatus 104 are registered as a database. The electric signal transmitted from the photoelectric conversion apparatus 104 to the image processing apparatus 105 is converted into image data corrected with the correction coefficient and a pixel registered as the defect pixel address is interpolated using the surrounding image data, instead of using a converted value of the electric signal of the defect pixel address. Thereby, a missing pixel such as bright spot and black spot is prevented from occurring.

Figure 33B:
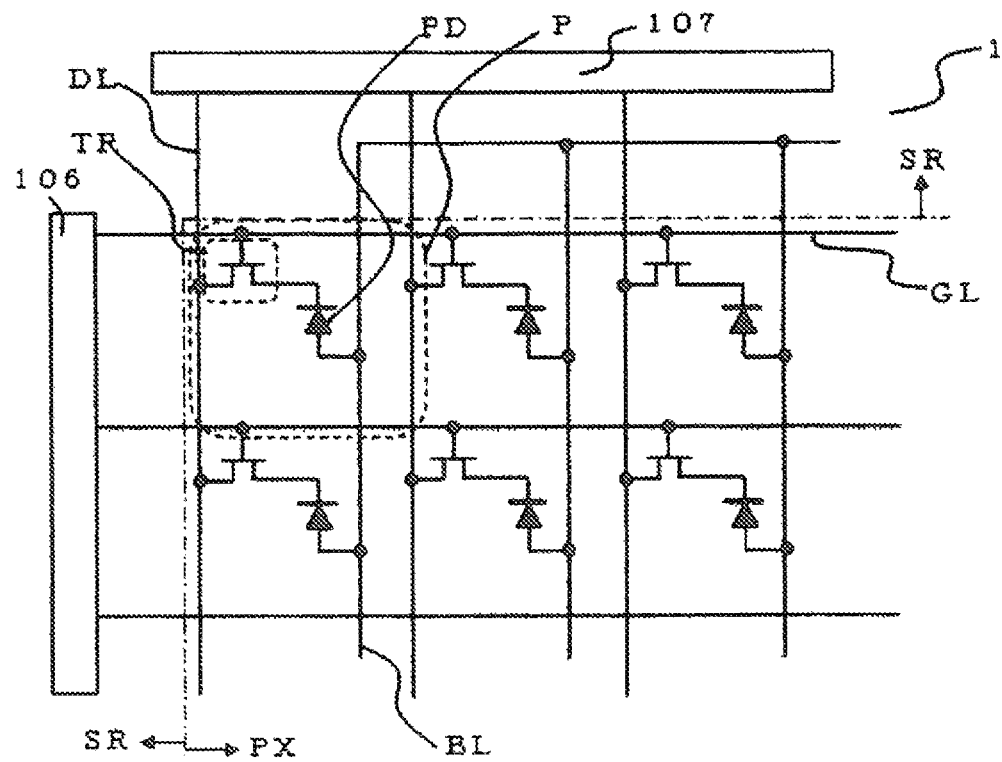

FIG. 33B is a plan view of the array substrate 1 of the photoelectric conversion apparatus according to the first illustrative embodiment. The array substrate 1 has a pixel part PX in which a plurality of pixels P is arranged side by side and a peripheral part SR around the pixel part, which includes an area in which terminals TP (not shown) and a conductive cover AH (not shown) are adhered and wirings extending over the terminals TP and the pixel part PX.

In the pixel part PX, a plurality of gate lines GL and a plurality of data lines DL intersecting with the gate lines GL are formed. A pixel P is defined by an area that is partitioned by the intersection of the gate line GL and the data line DL, and has a thin film transistor TR that is a switching element and a photodiode PD that is a photoelectric conversion element connected to the thin film transistor. A bias line BL is connected to a side of the photodiode PD of each pixel P, which is an opposite side to a side connecting with the thin film transistor TR. The bias line BL extends in parallel with the data line DL while connecting the photodiodes PD of the respective pixels P along the data line DL.

The bias line BL, the data line DL and the gate line GL extend from the pixel part PX to the periphery part SR and are connected to the terminals TP. The gate line GL is connected to a gate driving driver 106. Also, the data line DL is connected to a charge readout circuit 107. The charge readout circuit 107 has a low-noise amplifier or A/D converter embedded therein.

Figure 1:
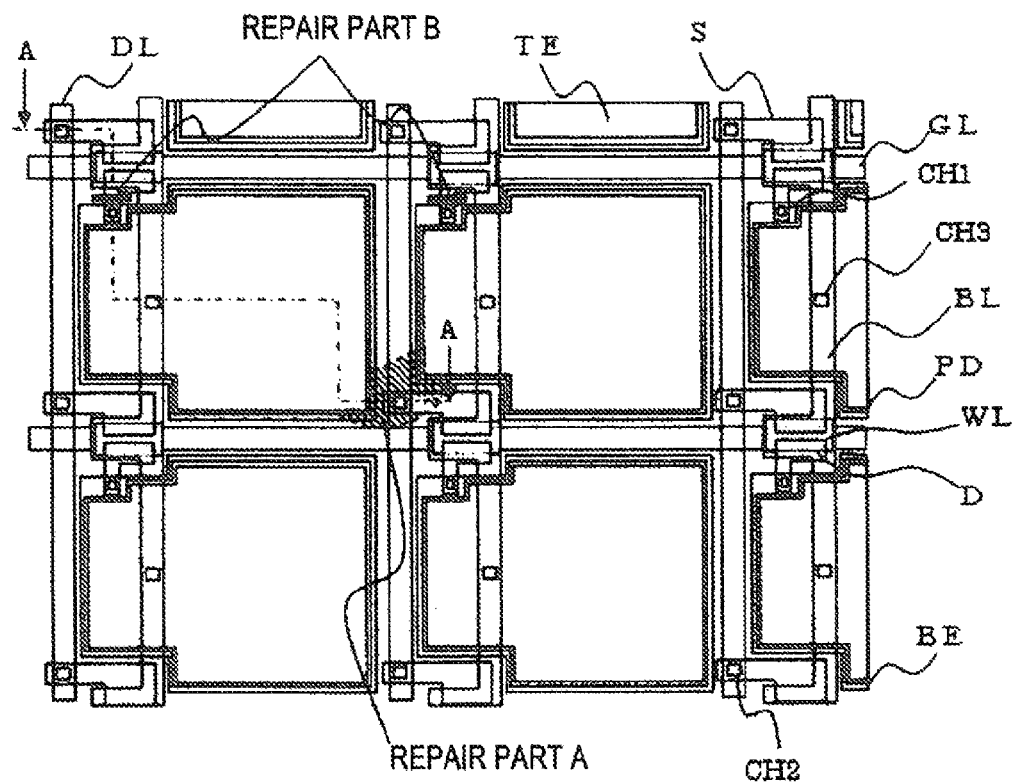
FIG. 1 is a plan view of an array substrate according to a first illustrative embodiment.
Figure 2:
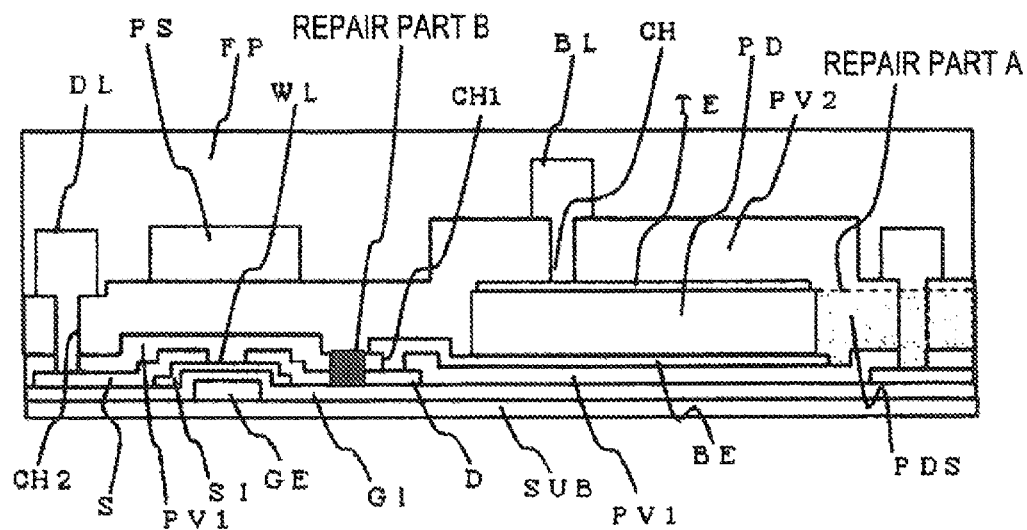
FIG. 2 is a sectional view of the array substrate according to the first illustrative embodiment.

FIG. 1 is a plan view of a pixel part of an array substrate of a photoelectric conversion apparatus according to a first illustrative embodiment. FIG. 2 is a sectional view taken along a line A-A of FIG. 1. A structure of the pixel part of the array substrate of the photoelectric conversion apparatus according to the first illustrative embodiment is described with reference to FIGS. 1 and 2.

A gate electrode GE and the gate line GL are formed on an insulation substrate SUB such as glass substrate by a metal having a low-resistance metal material such as aluminum (Al) as a main component. A gate insulation film GI is formed to cover the gate electrode GE and the gate line GL. An island-shaped semiconductor film SI is provided above the gate electrode GE via the gate insulation film GI. A source electrode S and a drain electrode D are provided to connect with the semiconductor film SI via a semiconductor film SN having conductive impurities doped therein. A channel WL is formed by the semiconductor film SI between the source electrode S and the drain electrode D.

A first interlayer insulation film PV1 is formed to cover the source electrode S, the drain electrode D and the semiconductor film SI. A lower electrode BE that connects with the drain electrode D via a contact hole CH1 opened through the first interlayer insulation film PV1 is formed on the first interlayer insulation film PV1. A photodiode PD that is a photoelectric conversion element is stacked on the lower electrode BE. The photodiode PD consists of an amorphous silicon film PD (n) having n-type impurities such as phosphor (P) doped therein, an intrinsic amorphous silicon film PD(i) and an amorphous silicon film PD(p) having p-type impurities such as boron (B) doped therein, which are sequentially stacked from the lower. In the below, the pin stacked structure of the silicon film configuring the photodiode and the silicon-stacked film at a state before patterning into the pin stacked structure may be collectively referred to as a silicon layer PDS of the photodiode.

An upper electrode TE that is a transparent electrode is formed on the photodiode PD. Via a contact hole CH3 opened through a second interlayer insulation film PV2 formed to cover the photodiode PD and the upper electrode TE, the upper electrode TE connects with the bias line 17 that is formed on the second interlayer insulation film PV2. The data line DL and a light shield film PS are formed on the same layer as the bias line BL, i.e., on the second interlayer insulation film PV2. The data line DL connects with the source electrode S via a contact hole CH2 opened through the first interlayer insulation film PV1 and second interlayer insulation film PV2.

Also, the data line DL is orthogonal to the gate line GL via the insulation layer. As described above, the pixel P is defined by an area that is partitioned by the intersection of the data line DL and the gate line GL. The light shield film PS formed at the same layer as the bias line BL is positioned on the thin film transistor TR and prevents light originating from a surface from being incident onto the semiconductor film SI or channel WL.

A planarization protection film FP is formed to cover the bias line BL, the data line DL and the light shield film PS. Although not shown, a scintillator may be formed on the planarization protection film FP.

In the pixels of the array substrate 1 having the above configuration, as shown in FIGS. 1 and 2, the silicon film PDS is fixed to remove at a repair part A by a repair operation to repair a pattern defect part of the silicon film PDS of the photodiode between the photodiodes PD, which are adjacent to each other while traversing the contact hole CH2.

Also, a repair for cutting off the electrical connection is performed at a repair part B of the drain electrode D of the pixel for which the repair processing has been made, more specifically, at a repair part B between the semiconductor film SI and the contact hole CH1. In other words, when there is a pixel having the photodiode PD in which at least a part thereof is fixed to have a shape different from that of a normal pixel between the pixels P adjacent to each other in the extending direction of the gate line GL, like the repair part A, the electrical connection between the photodiode PD and the data line DL is cut off in the thin film transistor TR of the corresponding pixel.

More specifically, the drain electrode is cut so that a part, at which the drain electrode connects with the semiconductor layer, and a part, at which the drain electrode connects with the photoelectric conversion element, are separated from each other. By this repair, at the repair part B, the drain electrode D and the first interlayer insulation film PV1 are removed and the electrical connection between the thin film transistor TR and the lower electrode BE is also cut off.

In the meantime, the repair part A has been described as regards the repair for only the silicon film PDS of the photodiode. However, when a pattern defect occurs in an upper electrode process of forming the upper electrode TE, the repair for the upper electrode TE may be performed. When a pattern defect occurs in a lower electrode process, the repair for the lower electrode BE may be performed.

Also, in FIGS. 1 and 2, it is shown that the repair has been performed so that the repair part A approximates a normal pattern of the photodiode PD. However, the upper electrode TE, the silicon film PDS and the lower electrode BE configuring the photodiode PD have only to be removed at least in an area, in which the contact hole CH2 is opened, by the repair. In other words, the shape of the photodiode PD may be fixed in the area including the contact hole CH2 connecting the data line DL and the source electrode S. Also, the shape of the photodiode PD may be fixed in an area including any one of the data line DL, the photodiode PD and between the data line DL and the photodiode PD insomuch as the area includes the contact hole CH2.

Figure 3:
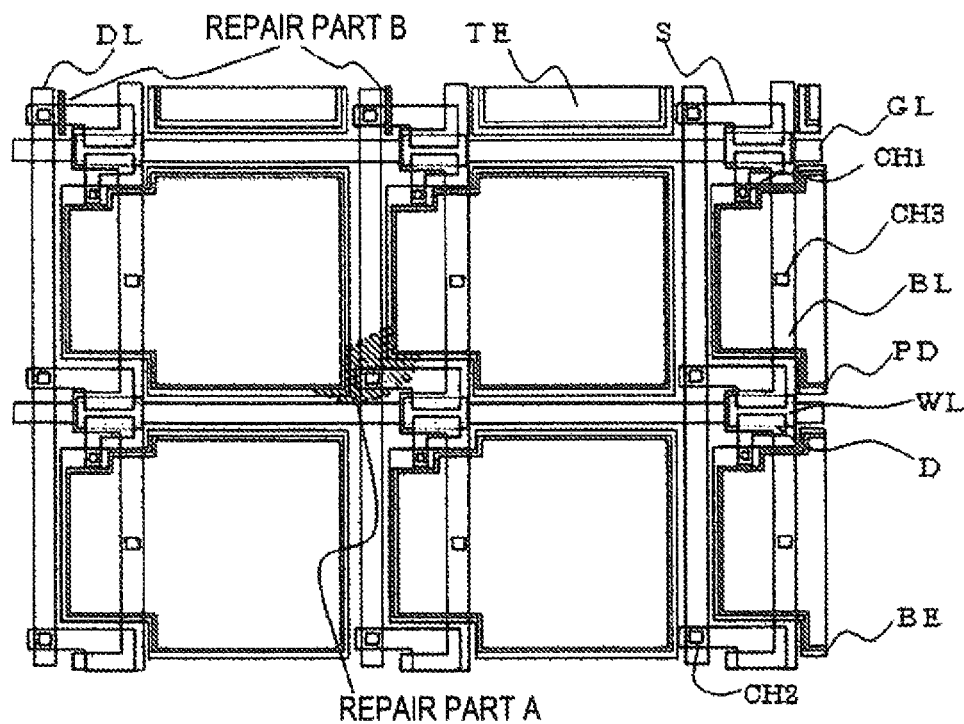
FIG. 3 is a plan view illustrating another disconnection part of an electrical connection of the first illustrative embodiment.
Figure 4:
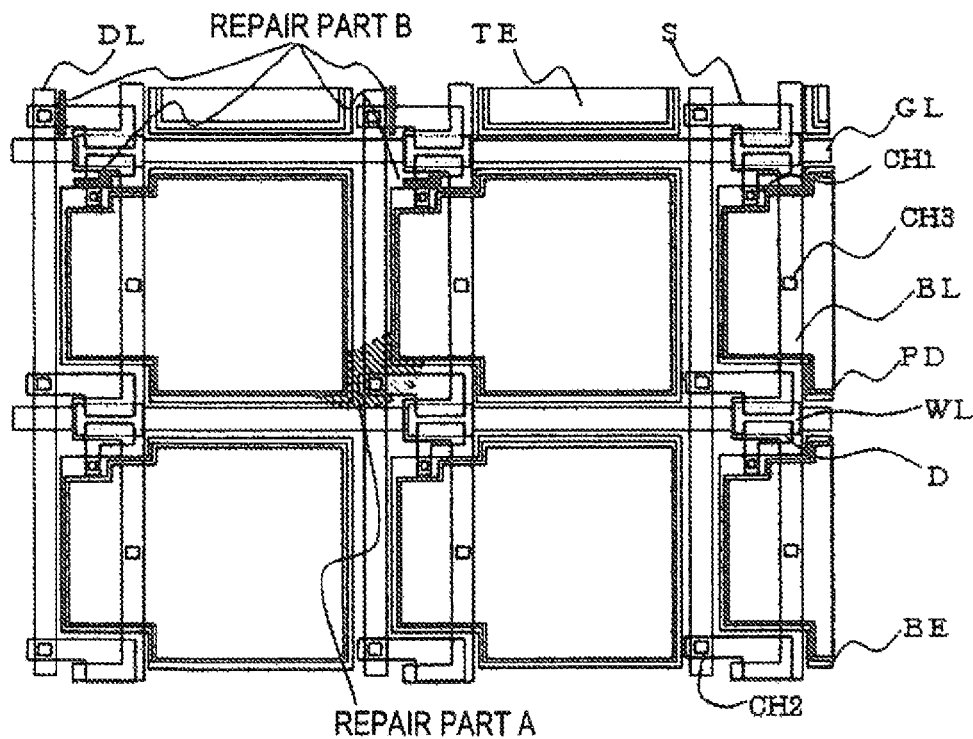
FIG. 4 is a plan view illustrating another disconnection part of an electrical connection of the first illustrative embodiment.

Also, the other repair examples are shown in FIGS. 3 and 4. As shown in FIG. 3, a repair that is performed at the repair part B of the drain electrode D may be performed at the source electrode S between the contact hole CH2 and the semiconductor film. That is, in a pixel fixed to have the different-shaped photoelectric conversion element, the source electrode may be cut so that a part, at which the source electrode connects with the semiconductor layer, and a part, at which the source electrode connects with the data line, are separated from each other. Also, as shown in FIG. 4, the repair may be performed both at the source electrode S and the drain electrode D.

In the first illustrative embodiment, an electric path with the bias line BL via the contact hole CH2 is cut off. Therefore, even though the photodiode PD is damaged upon the repair processing of the photodiode PD and the characteristic deterioration is thus accelerated for a long time of use, the corresponding defect is made to be the point defect in advance, so that a new point defect does not occur in an image after the correction. Hence, it is possible to provide the photoelectric conversion apparatus having high reliability.

A manufacturing process of the first illustrative embodiment is described below. The gate line GL is formed, the gate insulation film GI is formed thereon, the semiconductor SI, the source electrode S and the drain electrode D are formed and the thin film transistor TR that is the switching element is then formed. After that, the first interlayer insulation film PV1 is formed and the contact hole CH1 electrically connecting the drain electrode D and the lower electrode BE is opened.

Figure 5:
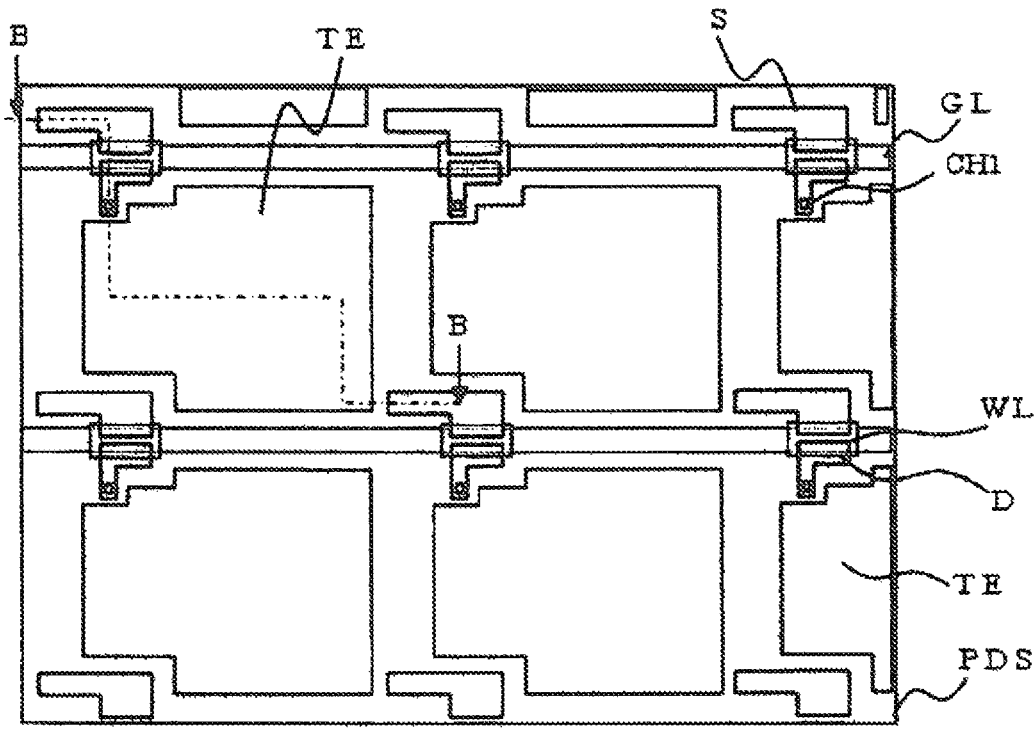
FIG. 5(a) and FIG. 5(b) illustrate a process of a method of manufacturing the array substrate according to the first illustrative embodiment.
Figure 5:
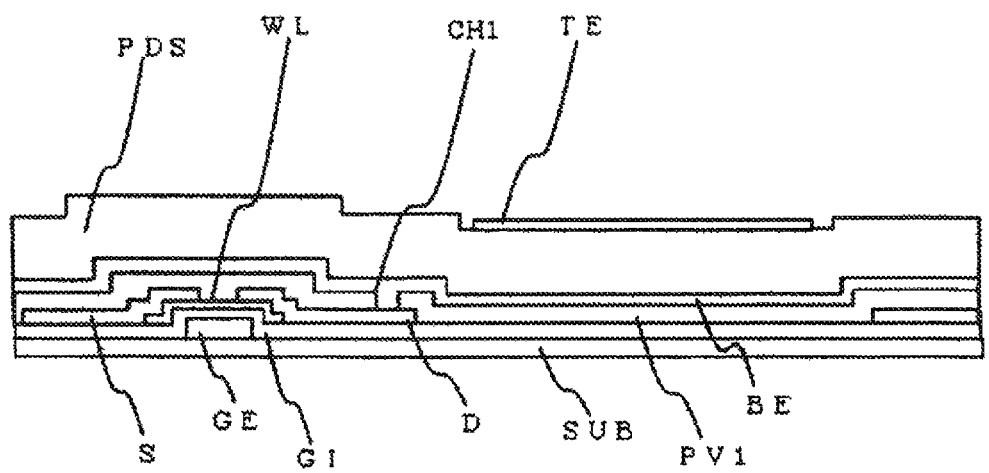

Next, a conductive film becoming the lower electrode BE, the silicon film PDS of the photodiode and a transparent conductive film becoming the upper electrode TE are sequentially formed. Then, the upper electrode TE is patterned. This state is shown in FIG. 5(a) and FIG. 5(b) that is a sectional view taken along a line B-B of FIG. 5(a). Hereinafter symbol (a) illustrates a plan view, and symbol (b) illustrates a sectional view thereof. It should be noted that the data line DL is not formed yet.

Figure 6:
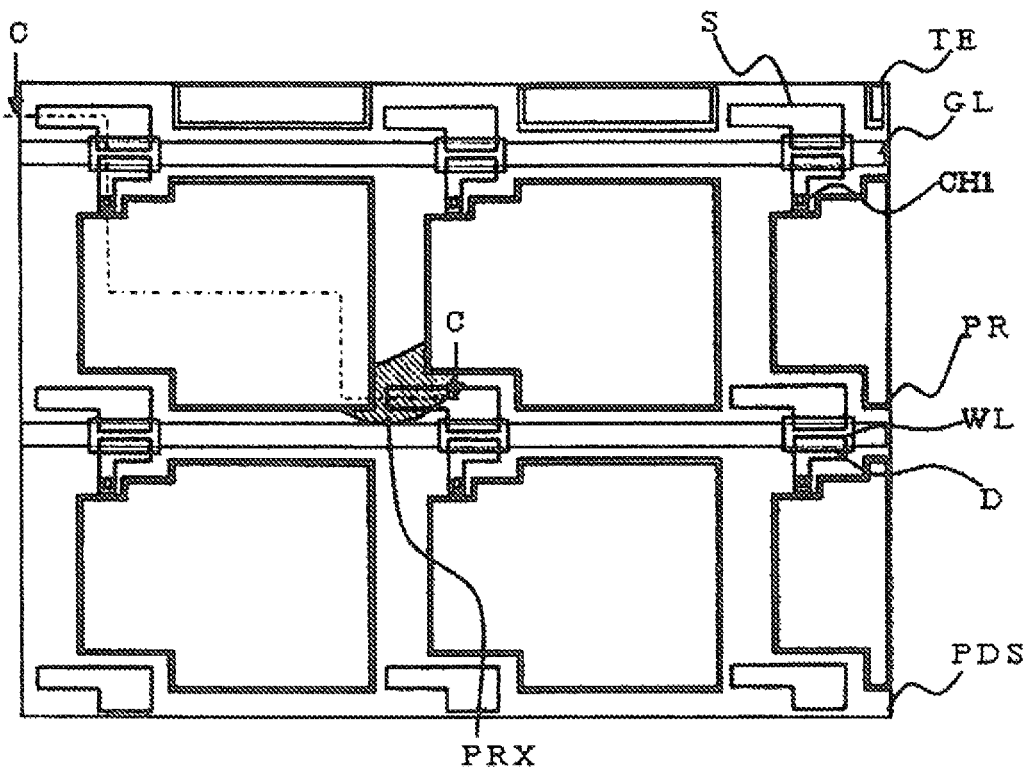
FIG. 6(a) and FIG. 6(b) illustrate the process of the method of manufacturing the array substrate according to the first illustrative embodiment.
Figure 6:
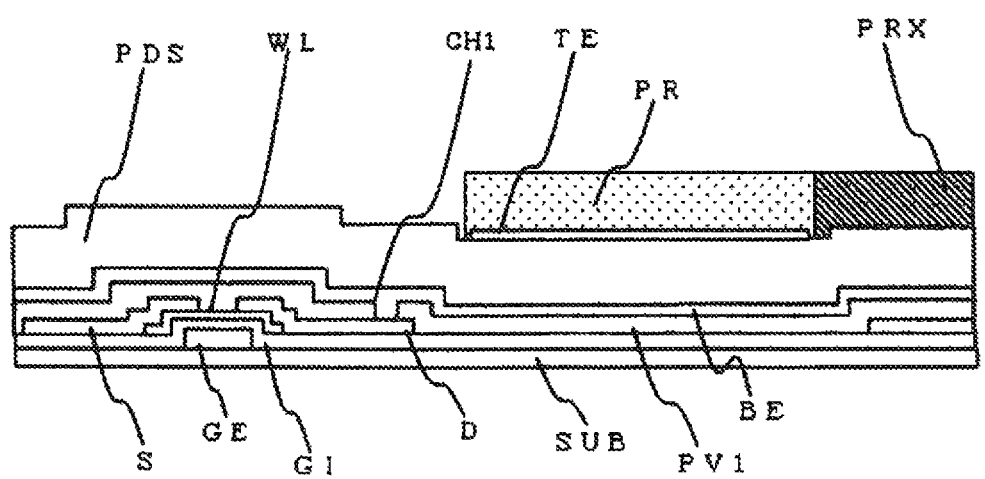

Next, a resist PR for patterning the silicon film PDS of the photodiode is formed. After the resist patterning, a defect inspection is performed by an image recognition and the like to thus detect a resist pattern defect and to register a defect address. This state is shown in FIG. 6(a) and FIG. 6(b) that is a sectional view taken along a line C-C of FIG. 6(a). FIG. 6 shows a case where a resist pattern residue PRX occurs at a part of the contact hole CH2 due to a process problem upon the resist formation, in addition to the resist PR that should be essentially formed.

Figure 7:
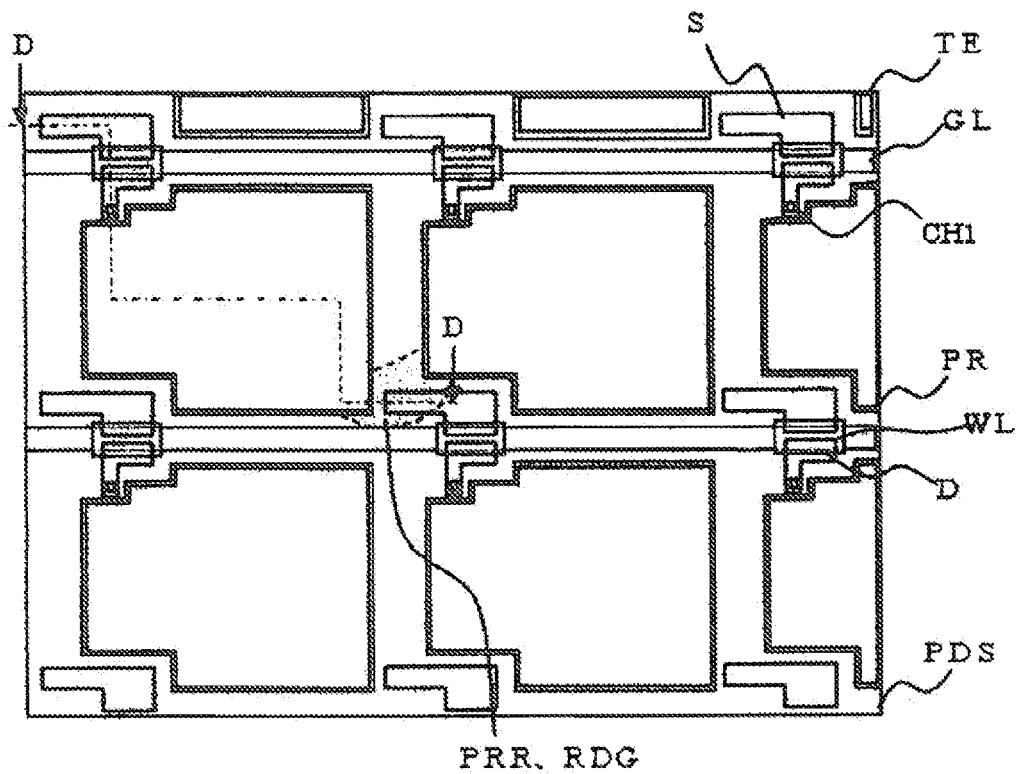
FIG. 7(a) and FIG. 7(b) illustrate the process of the method of manufacturing the array substrate according to the first illustrative embodiment.
Figure 7:
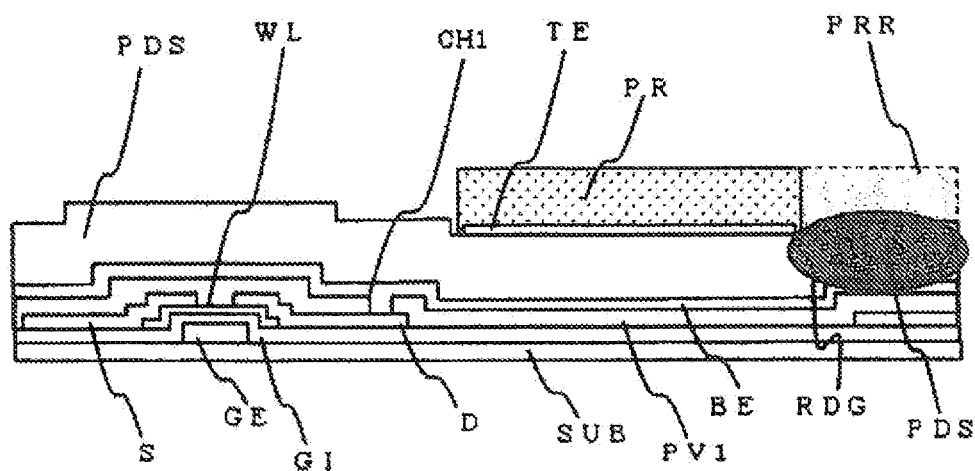

Next, the resist pattern defect part PRX is removed in the pixel having the address registered as the resist pattern defect by the laser repair and the like. This state is shown in FIG. 7(a) and FIG. 7(b) that is a sectional view taken along a line D-D of FIG. 7(a). In FIG. 7, the resist PRR that has been removed by the laser repair is indicated with the dotted line. Since the laser repair removes the resist by the laser heat, the silicon film PDS of the lower layer is damaged or the impurities are diffused due to the heat. In FIG. 7(b), the repair damaged part is indicated with RDG.

Figure 8:
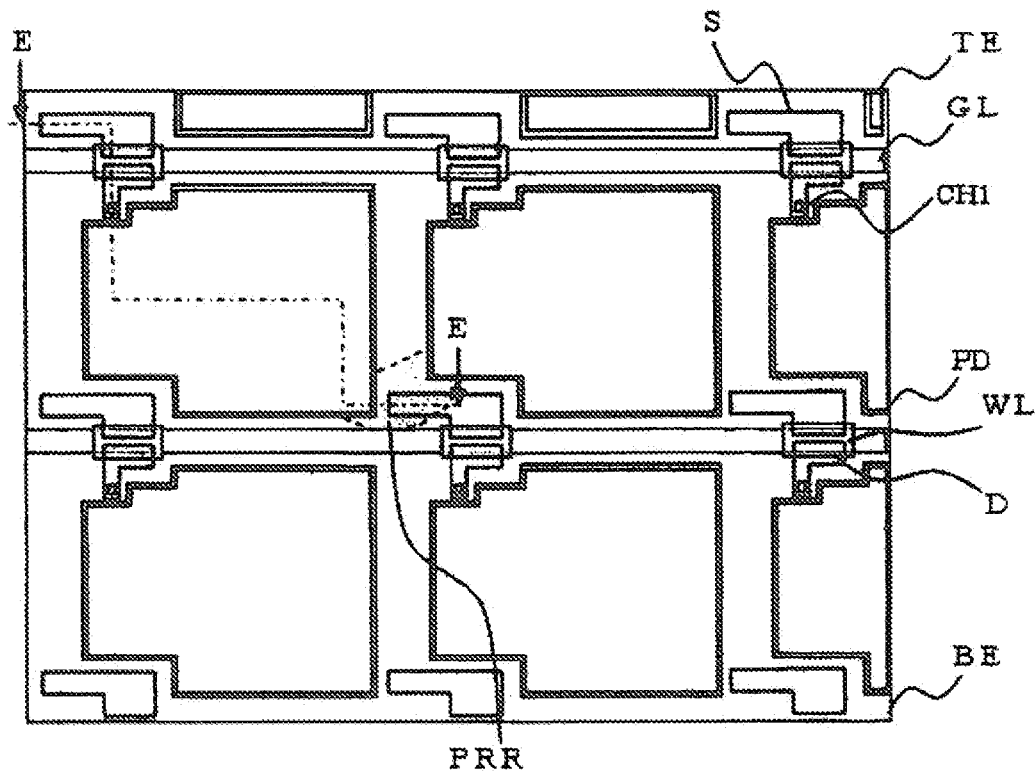
FIG. 8(a) and FIG. 8(b) illustrate the process of the method of manufacturing the array substrate according to the first illustrative embodiment.
Figure 8:
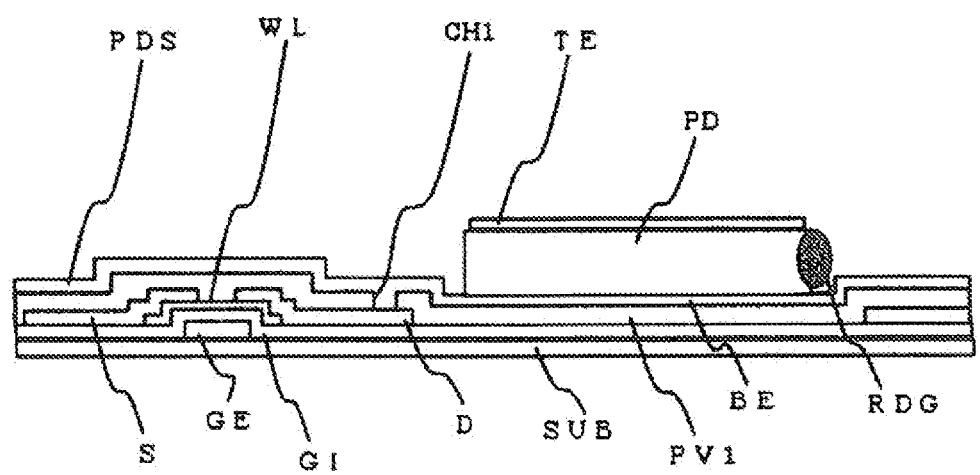

Next, the silicon film PDS of the photodiode is etched to remove the resist by using the resist pattern after the repair as an etching mask. This state is shown in FIG. 8(a) and FIG. 8(b) that is a sectional view taken along a line E-E of FIG. 8(a). It can be seen from FIG. 8 that the pattern residue of the silicon film PDS, which might remain as the pattern residue at a part at which the contact hole CH2 will be formed, has been avoided by the laser repair performed in FIG. 7.

Figure 9:
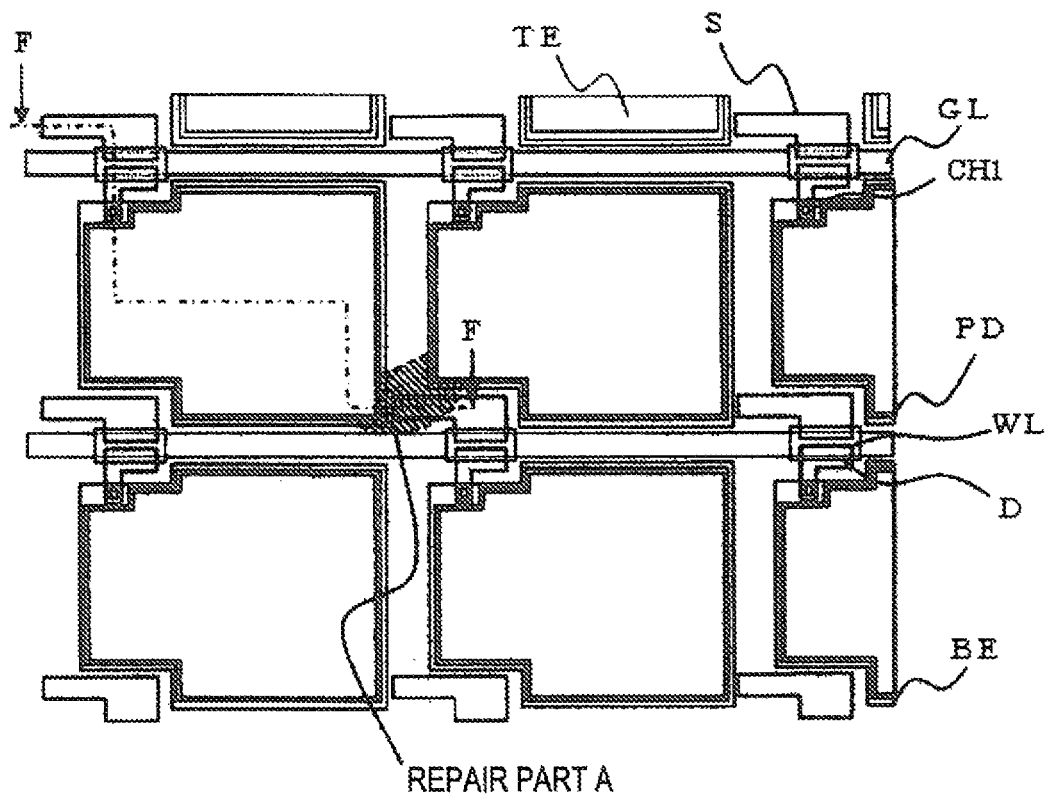
FIG. 9(a) and FIG. 9(b) illustrate the process of the method of manufacturing the array substrate according to the first illustrative embodiment.
Figure 9:
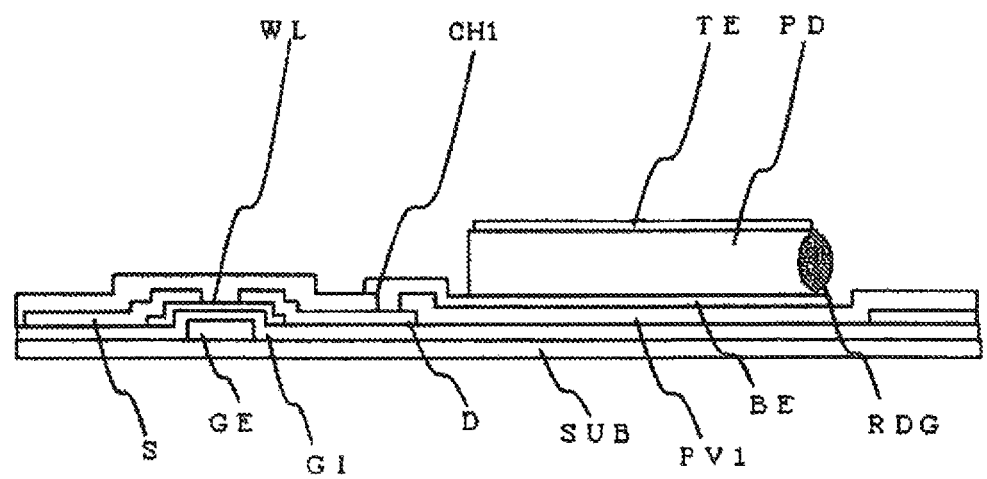

Next, the lower electrode BE is patterned. This state is shown in FIG. 9(a) and FIG. 9(b) that is a sectional view taken along a line F-F of FIG. 9(a).

Figure 10:
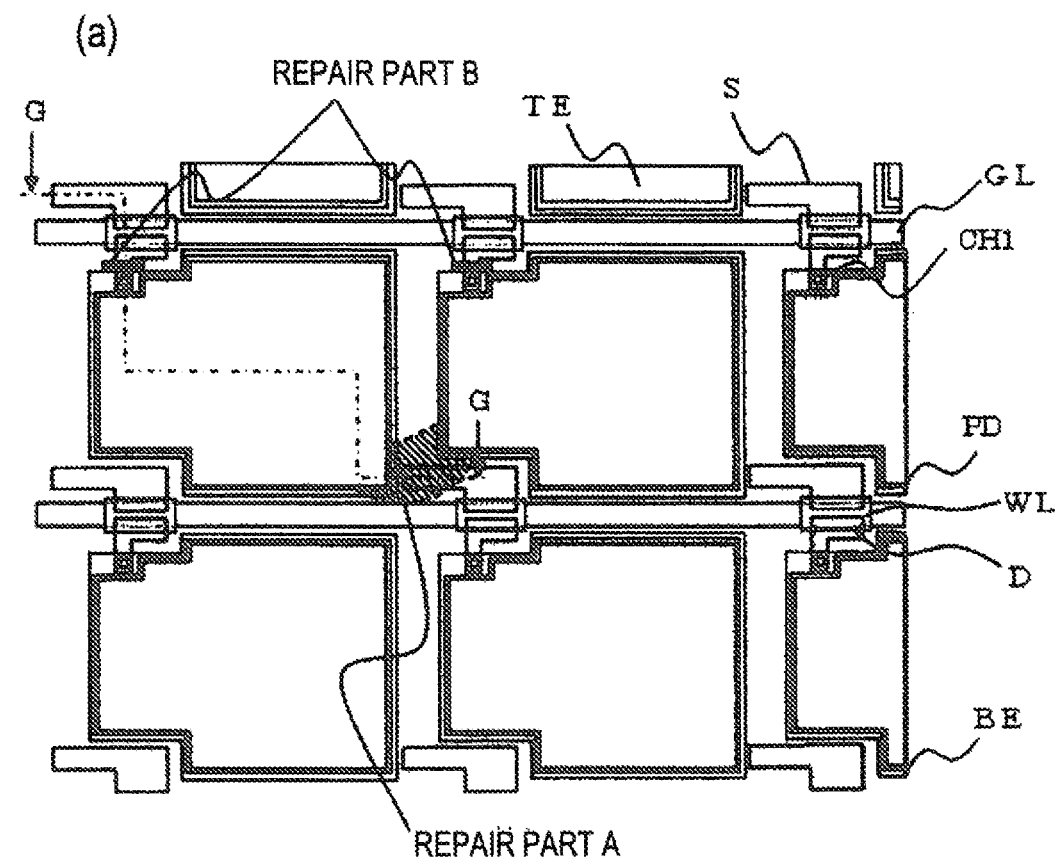
FIG. 10(a) and FIG. 10(b) illustrate the process of the method of manufacturing the array substrate according to the first illustrative embodiment.
Figure 10:
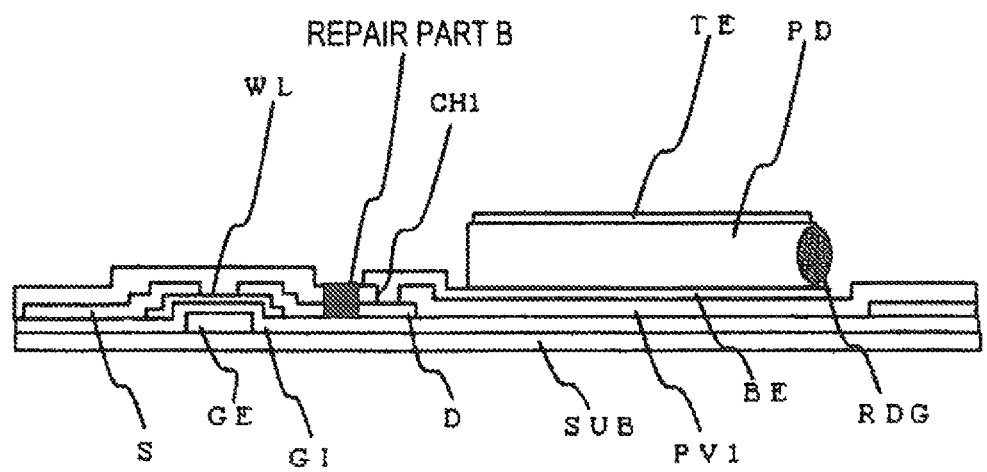

Next, the drain electrode D of the pixel, which was address-registered as a defect and for which the resist repair of the silicon film PDS of the photodiode was performed, is cut from the first interlayer insulation film PV1 by the laser repair method and the like. This state is shown in FIG. 10(a) and FIG. 10(b) that is a sectional view taken along a line G-G of FIG. 10(a). By this repair, the drain electrode D and the first interlayer insulation film PV1 at the repair part are removed, and the electrical connection between the thin film transistor TR and the lower electrode BE is also cut off.

Figure 11:
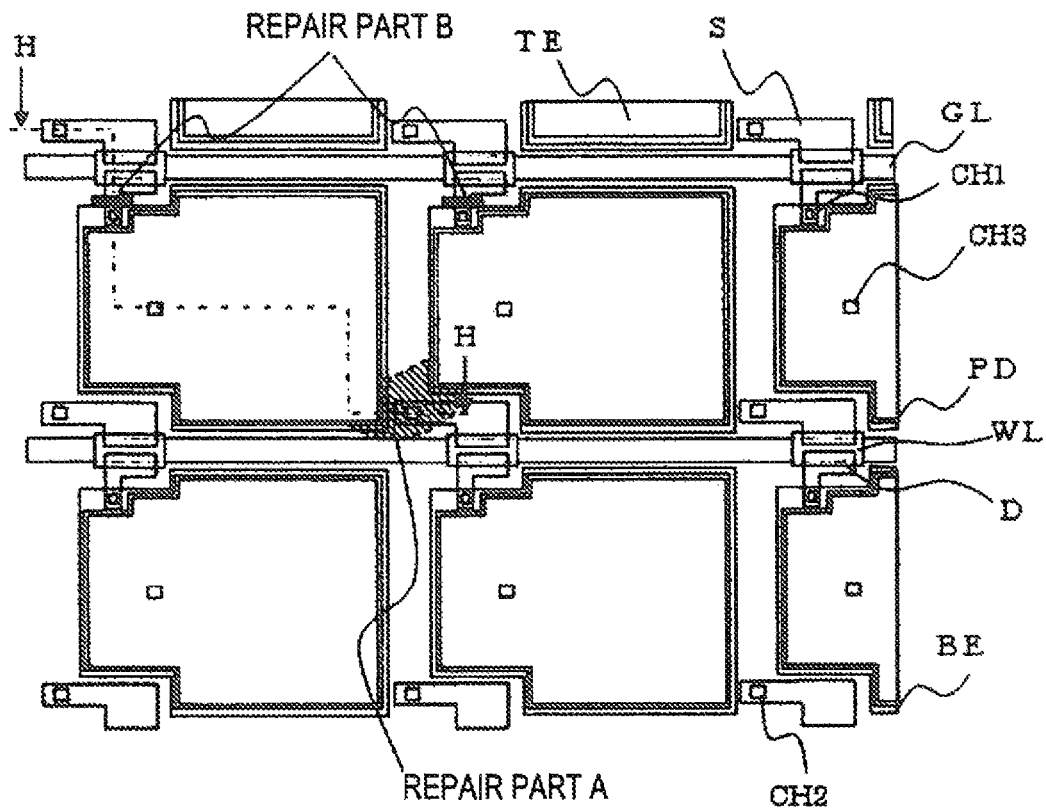
FIG. 11(a) and FIG. 11(b) illustrate the process of the method of manufacturing the array substrate according to the first illustrative embodiment.
Figure 11:
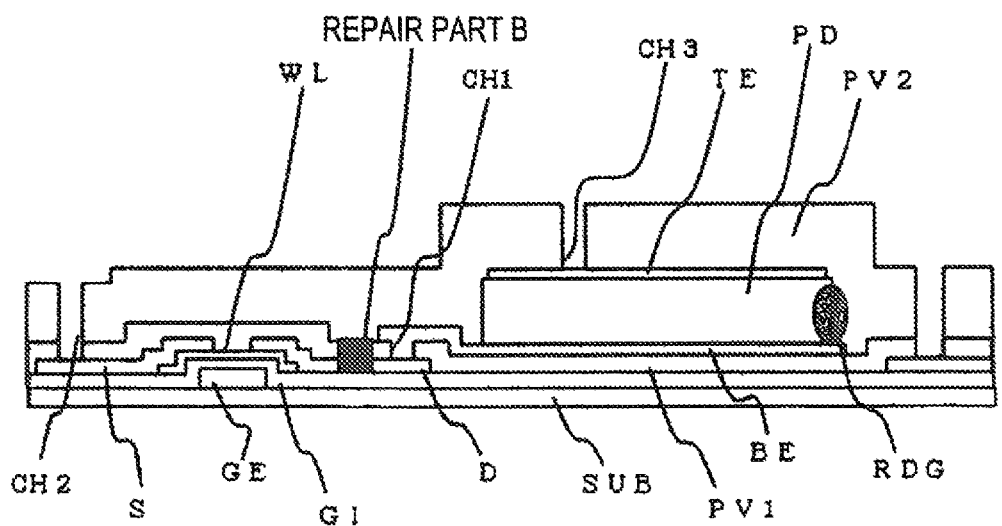

Next, the second interlayer insulation film PV2 is formed, and then the contact hole CH2 forming an opening to the source electrode S, the contact hole CH3 forming an opening to the upper electrode TE and a contact hole (which is not shown for the wiring conversion part of the peripheral part of the array substrate) forming an opening to the gate line GL are formed. This state is shown in FIG. 11(a) and FIG. 11(b) that is a sectional view taken along a line H-H of FIG. 11(a).

Next, the data line DL, the bias line BL and the light shield film PS are formed with the low-resistance metal and the planarization protection film FP is then formed, so that the structure as shown in FIGS. 1 and 2 is made. Meanwhile, in FIG. 2, the planarization protection film FP is shown as a monolayer. However, the planarization protection film may have a stacked structure of an insulation film, which is formed by a CVD method, and a coated insulation film. Then, terminal electrodes (not shown) are formed, so that the array substrate is completed.

The pixel registered as the defect address is registered as a correction target pixel at a system.

Meanwhile, in this illustrative embodiment, after the resist pattern of the silicon film PDS of the photodiode is repaired, the silicon film PDS is etched to modify the pattern defect by using the repaired resist pattern as the mask. However, the silicon film PDS of the photodiode may be removed by the laser repair method and the like insomuch as it is in an area not extending to the gate line GL.

Second Illustrative Embodiment

FIG. 12(a) is a plan view of a pixel part of an array substrate of a photoelectric conversion apparatus according to a second illustrative embodiment and FIG. 12(b) is a sectional view taken along a line J-J of FIG. 12(a).

Figure 12:
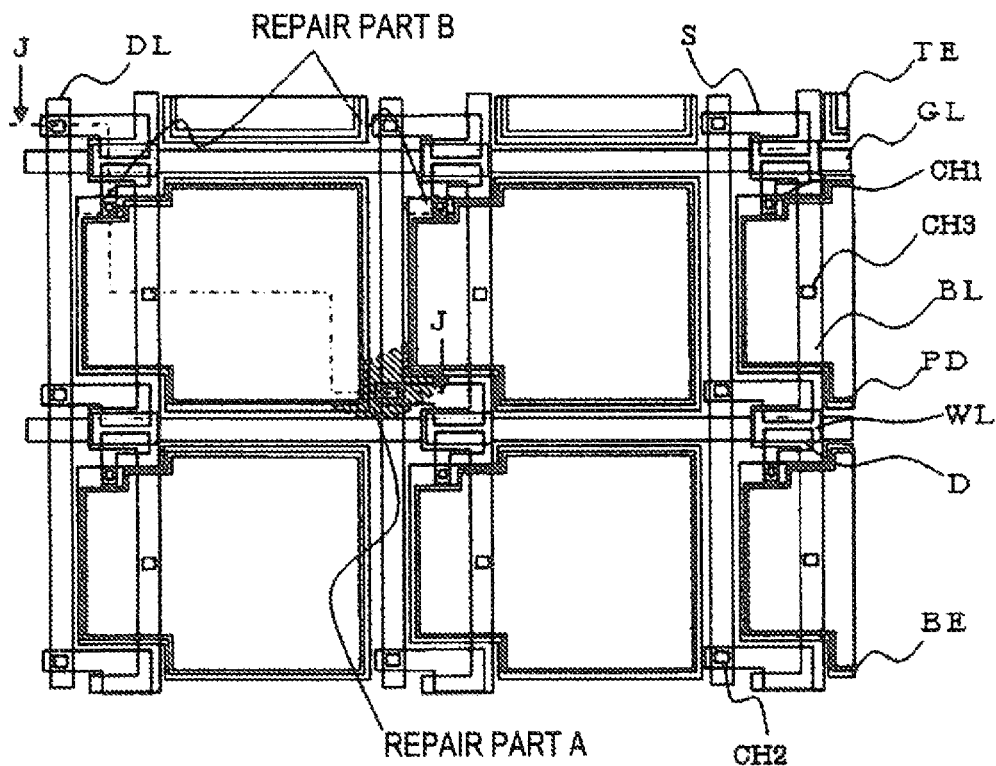
FIGS. 12(a) and 12(b) are a plan view and a sectional view of an array substrate according to a second illustrative embodiment.
Figure 12:
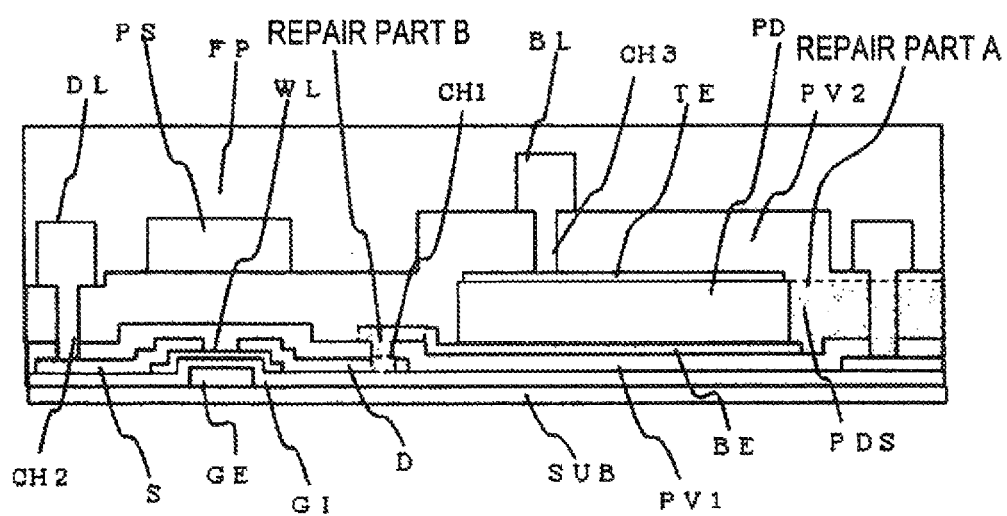

In the first illustrative embodiment, the drain electrode D forming the thin film transistor TR is cut at the repair part B by the repair. When there is a pixel having the photodiode PD in which at least a part thereof is fixed to have a shape different from a normal pixel between the pixels P adjacent to each other in the extending direction of the gate line GL, like the repair part A, the electrical connection between the photodiode PD and the data line DL is cut off in the thin film transistor TR of the corresponding pixel, which is common to the first illustrative embodiment. However, as shown in FIG. 12, in the second illustrative embodiment, the lower electrode BE around the contact hole CH1 connecting the lower electrode BE and the drain electrode D is removed in the process of forming the lower electrode BE. Meanwhile, FIG. 12 shows a case where the drain electrode D is etched using an etching solution for the lower electrode BE. However, when not etched, only the lower electrode BE is removed.

In the second illustrative embodiment, the process of removing the first interlayer insulation film PV1 and cutting the drain electrode D, like the first illustrative embodiment, is not performed. Therefore, it is possible to reduce a possibility that the residues such as insulation film and the like, which are generated upon the repair at the repair part B, will move and be a defect in a cleaning process and the like. Also, since an end surface of the repair part B is formed by the etching, it is possible to suppress the coverage inferiority of the second interlayer insulation film PV2 from occurring.

In the below, the manufacturing method is described. In the meantime, since the processes from the repair of the repair part A to the patterning of the silicon film PDS of the photodiode are the same as those of the first illustrative embodiment, the descriptions thereof are omitted.

Figure 13:
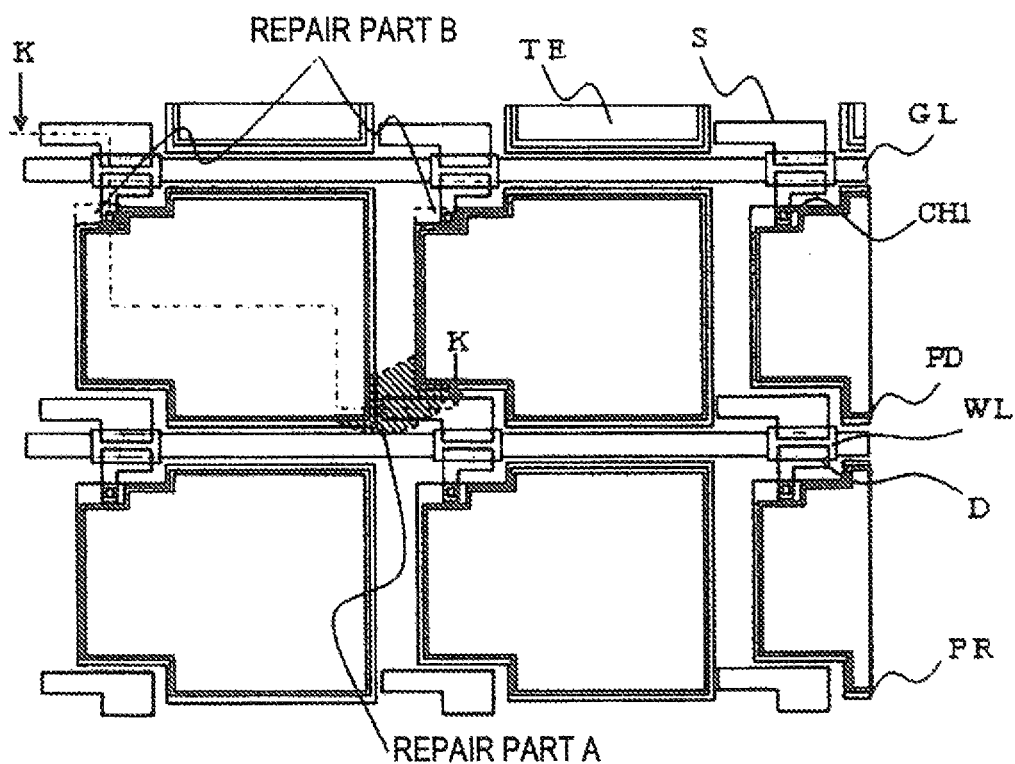
FIG. 13(a) and FIG. 13(b) illustrate a process of a method of manufacturing the array substrate according to the second illustrative embodiment.
Figure 13:
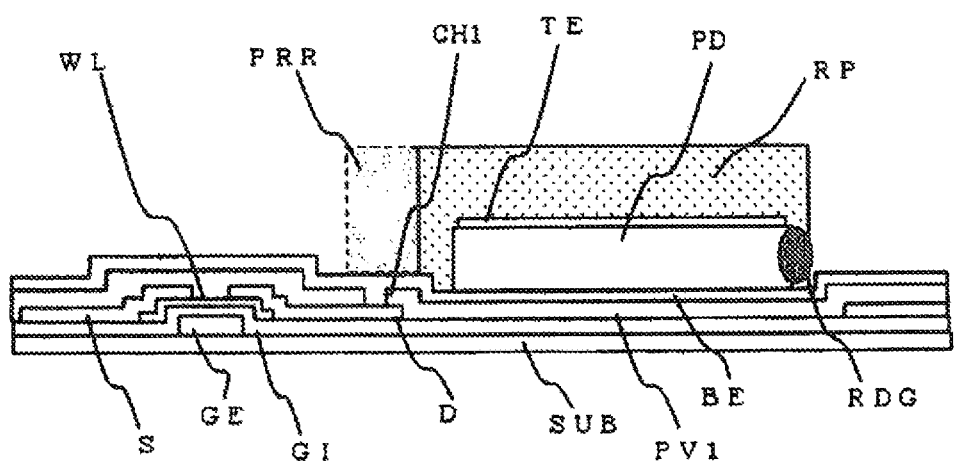

After performing the resist patterning of the lower electrode BE, the resist is removed by the laser repair and the like so that it becomes a shape including the contact hole CH1 of the pixel, which was address-registered as a defect and for which the resist repair of the silicon film PDS of the photodiode was performed. This state is shown in FIG. 13(a) and FIG. 13(b) that is a sectional view taken along a line K-K of FIG. 13(a). Meanwhile, in FIG. 13(b), the repair part PRR of the resist pattern that has been removed by the laser repair is indicated with the dotted line.

Figure 14:
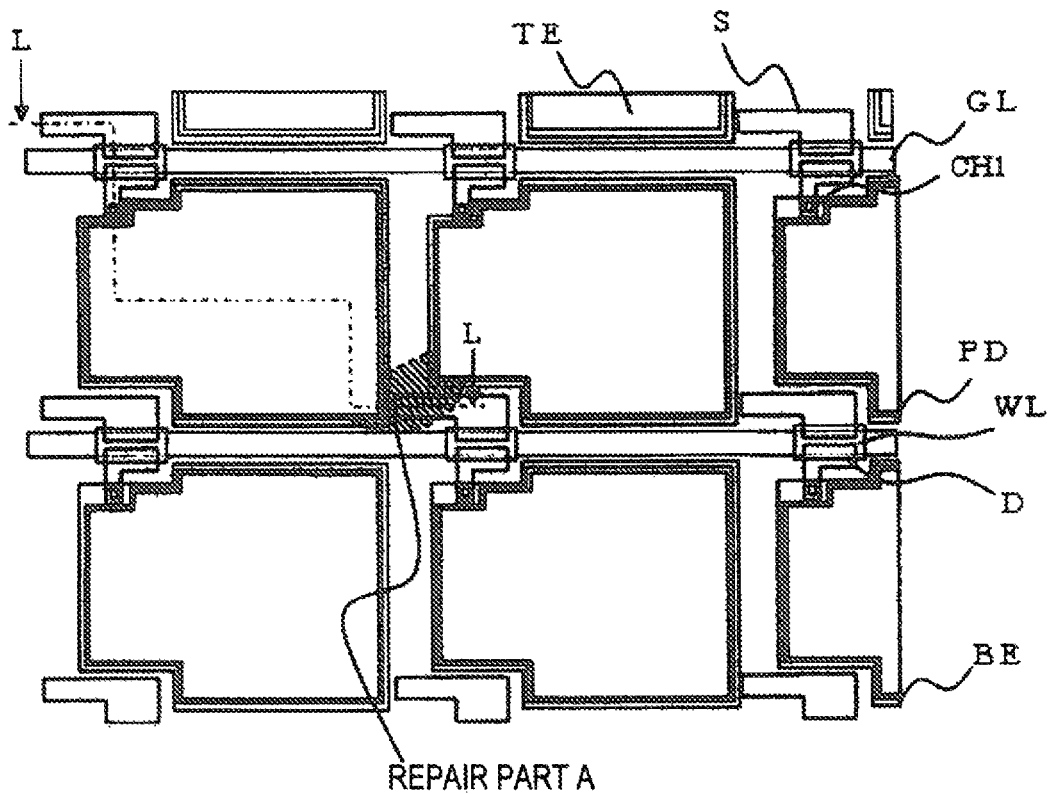
FIG. 14(a) and FIG. 14(b) illustrate the process of the method of manufacturing the array substrate according to the second illustrative embodiment.
Figure 14:
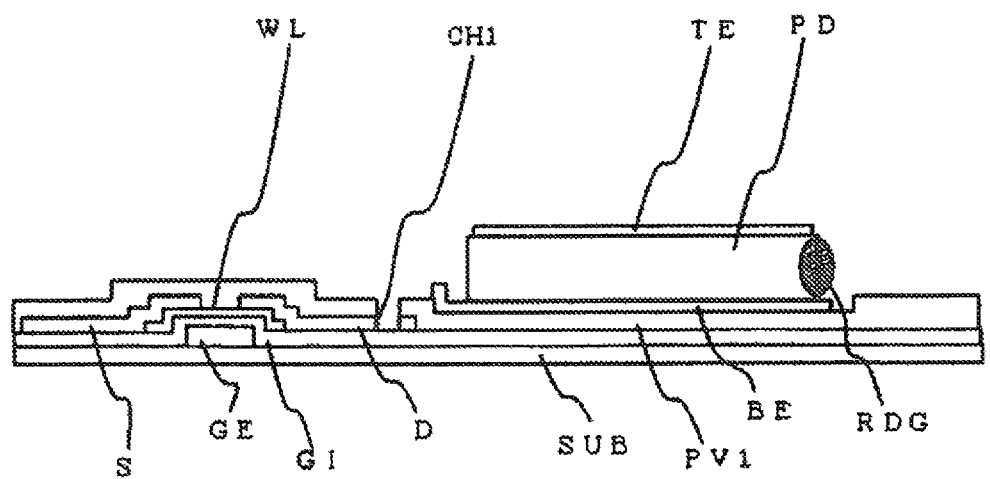

Next, the lower electrode BE is etched to remove the resist. This state is shown in FIG. 14(a) and FIG. 14(b) that is a sectional view taken along a line L-L of FIG. 14(a). For example, when the drain electrode D is made of chromium alloy and the lower electrode BE is also made of chromium alloy, a part of the drain electrode BE at the lower layer of the contact hole CH1 in which the resist was removed upon the etching of the lower electrode BE is also etched. On the other hand, when the drain electrode D and the lower electrode BE are formed of different conductive films having etching selectivity, the drain electrode D is not etched.

Next, the second interlayer insulation film PV2 is formed. Since the processes thereafter are the same as those of the first illustrative embodiment, the descriptions thereof are omitted.

Third Illustrative Embodiment

In the first and second illustrative embodiments, the repair for the pattern defect traversing the contact hole CH2 has been described. In a third illustrative embodiment, a repair for a pattern defect, which occurs below the data line without traversing the contact hole CH2, is described.

In order to describe the different points of the third illustrative embodiment from the first and second illustrative embodiments, a plan view of the third illustrative embodiment is shown in FIG. 15(a) and a sectional view taken along a line M-M of FIG. 15(a) is shown in FIG. 15(b).

When the pattern defect of the repair part A is a resist pattern defect that is not caused by the foreign material in the silicon film PDS of the photodiode, even though the silicon film PDS remains, it does not form a short part with the data line DL. This is because the silicon film PDS and the data line DL are formed at the different layers via the second interlayer insulation film PV2.

However, when the pattern defect is caused by the foreign material in the silicon film PDS of the photodiode and the silicon film PDS of the photodiode is exposed to a surface of the second interlayer insulation film PV2 upon the formation of the second interlayer insulation film PV2, the bias line BL and the data line DL are electrically conducted via the exposed silicon film PDS.

Figure 15:
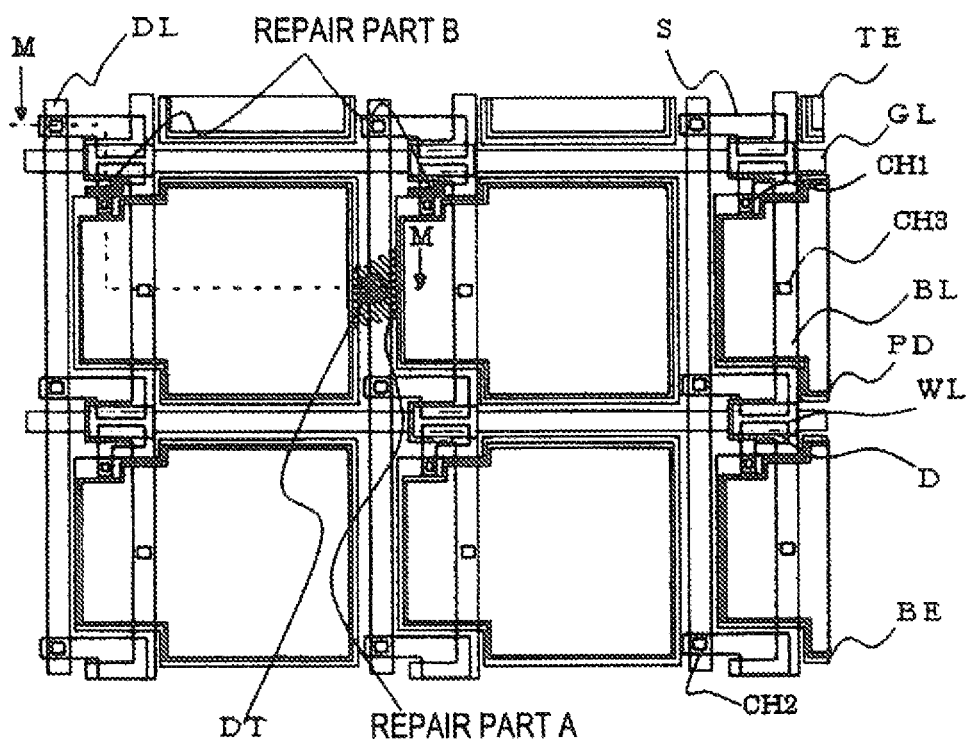
FIGS. 15(a) and 15(b) are a plan view and a sectional view of an array substrate according to a third illustrative embodiment.
Figure 15:
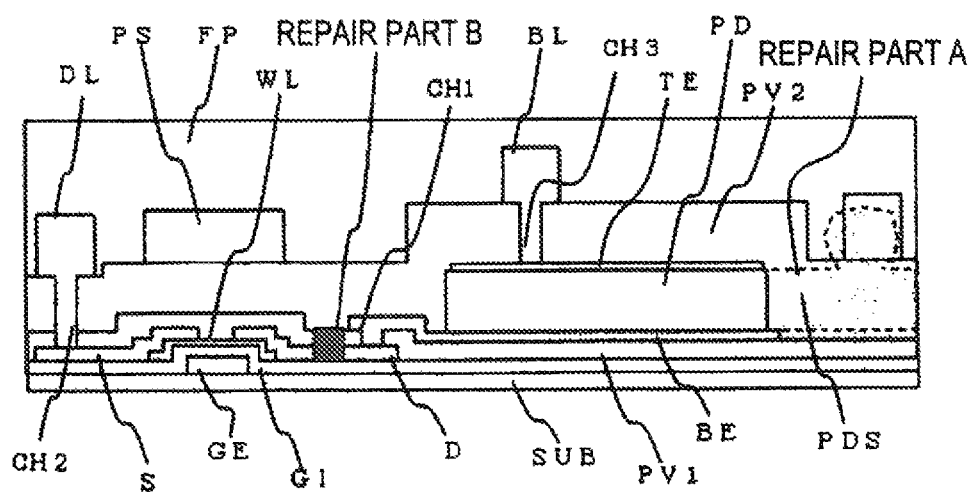

In FIG. 15, a part of the repair part A shown with the dotted line indicates that the silicon film PDS including foreign material DT therein has been removed. As the removing method, the method of etching and removing the silicon film with the repair of the resist pattern or the method of removing the silicon film PDS of the pattern defect part by the laser repair may be used, like the first and second illustrative embodiments.

In the meantime, as a modified embodiment of the third illustrative embodiment, a repair example in which it is difficult to perform the repair for the foreign material in the silicon film PDS is shown in FIG. 16(a) and FIG. 16(b) that is a sectional view taken along a line N-N of FIG. 16(a). Unlike FIG. 15, both the foreign material DT and the silicon film PDS remain in an area adjacent to the repair part A. Also in this case, a part of the pixel part adjacent to the pattern defect caused by the foreign material DT in the silicon film PDS is removed to separate the pattern defect part. Thereby, even when there is a pattern defect having a possibility that it will be shorted with the data line DL, the pattern defect can be made to be a point defect having no change.

Figure 16:
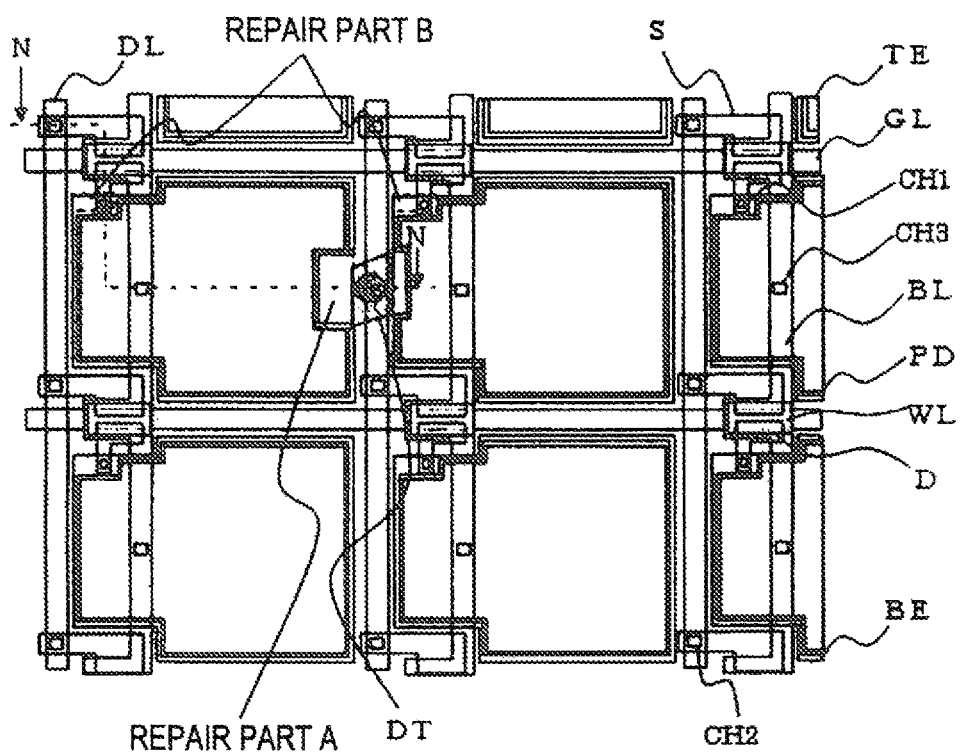
FIGS. 16(a) and 16(b) are a plan view and a sectional view of a modified embodiment of the array substrate according to the third illustrative embodiment.
Figure 16:
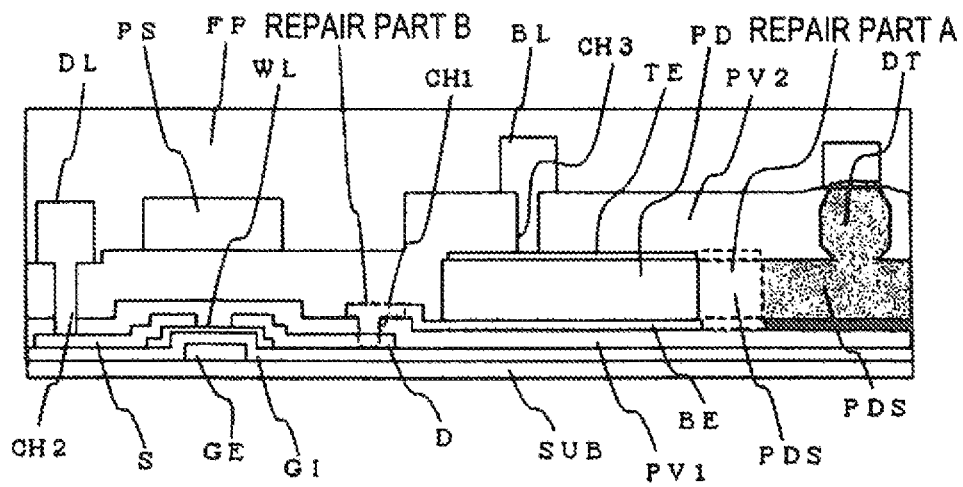

In the meantime, regarding the repair of the repair part B, the method described in the first illustrative embodiment is applied in FIG. 15 and the method described in the second illustrative embodiment is applied in FIG. 16. However, any of the methods described in the first and second illustrative embodiments can be used.

In the below, a method of manufacturing the structure having the pattern defect caused by the foreign material DT in the silicon film PDS, as shown in FIG. 16, is described.

Figure 17:
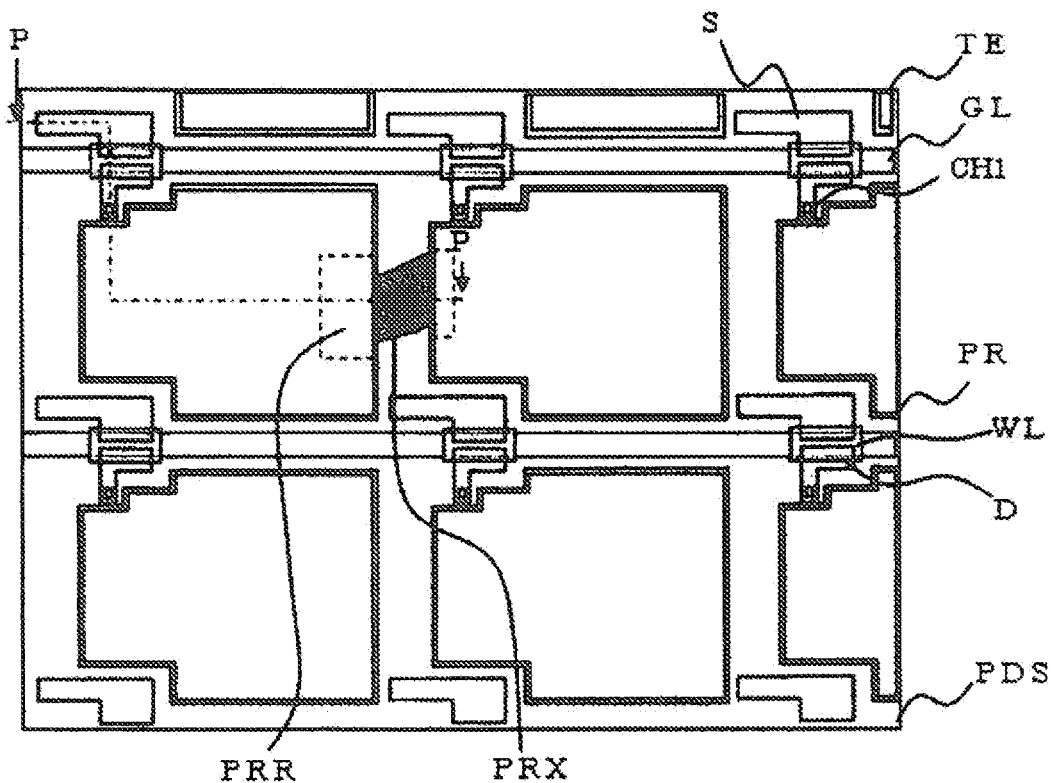
FIG. 17(a) and FIG. 17(b) illustrate a process of a method of manufacturing the array substrate according to the third illustrative embodiment.
Figure 17:
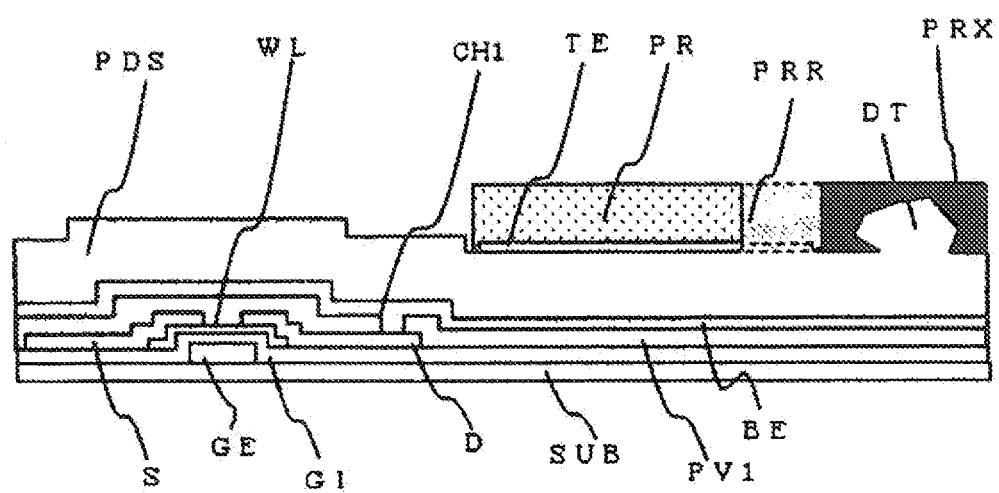

After forming the resist pattern PR for patterning the silicon film PDS of the photodiode, a defect inspection is performed by the image recognition and the like to thus detect a resist pattern defect PRX and to register a defect address. In the pixel of the defect address, the resist patterns PRR at both sides of the foreign material DT part and the pattern of the upper electrode TE positioned below thereof are removed by the laser repair method and the like. This state is shown in FIG. 17(a) and FIG. 17(b) that is a sectional view taken along a line P-P of FIG. 17(a). In the meantime, the area that is removed by the laser repair method and the like is shown with the dotted line.

In the meantime, regarding a case where the resist pattern PR and the upper electrode TE are collectively removed by the repair method, since the processing margin may be low depending on the specification of the repair apparatus, the upper electrode TE may be laser-repaired in advance upon the pattern formation of the upper electrode TE. When the upper electrode TE is laser-repaired in advance, a weak acid is generally used to etch the upper electrode TE that is the transparent conductive film. However, when the repair is performed at the resist pattern state of the upper electrode TE, the transparent conductive film is crystallized, so that the upper electrode may not be etched by the weak acid. Hence, it is preferable to perform the laser repair after forming the pattern of the upper electrode TE.

Figure 18:
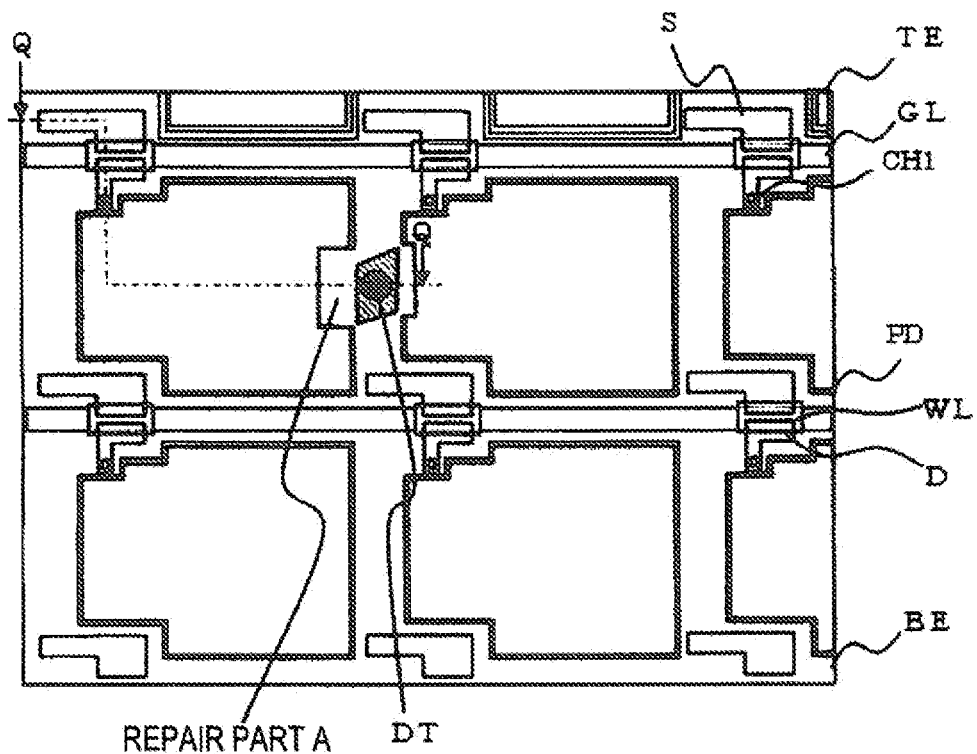
FIG. 18(a) and FIG. 18(b) illustrate the process of the method of manufacturing the array substrate according to the third illustrative embodiment.
Figure 18:
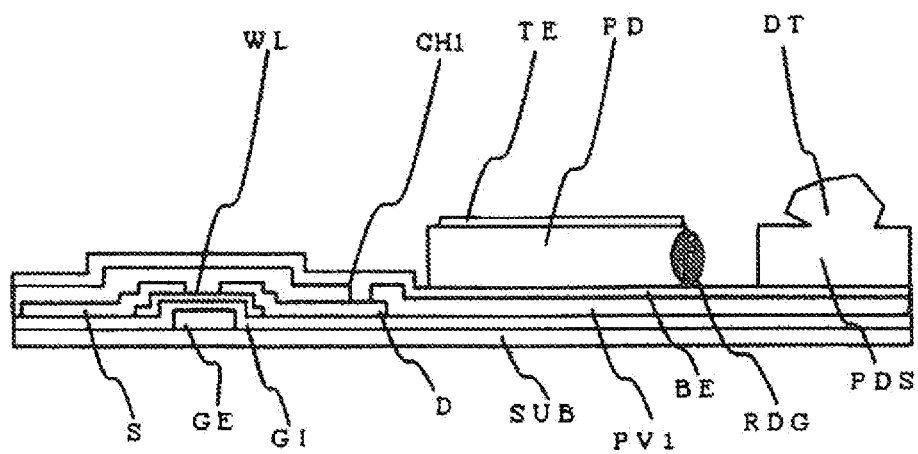

The patterned state of the silicon film PDS of the photodiode is shown in FIG. 18(a) and FIG. 18(b) that is a sectional view taken along a line Q-Q of FIG. 18(a). Although the pattern of the foreign material DT remains in the silicon film PDS of the photodiode, it is separated from the pattern of the photodiode PD in the pixel.

Figure 19:
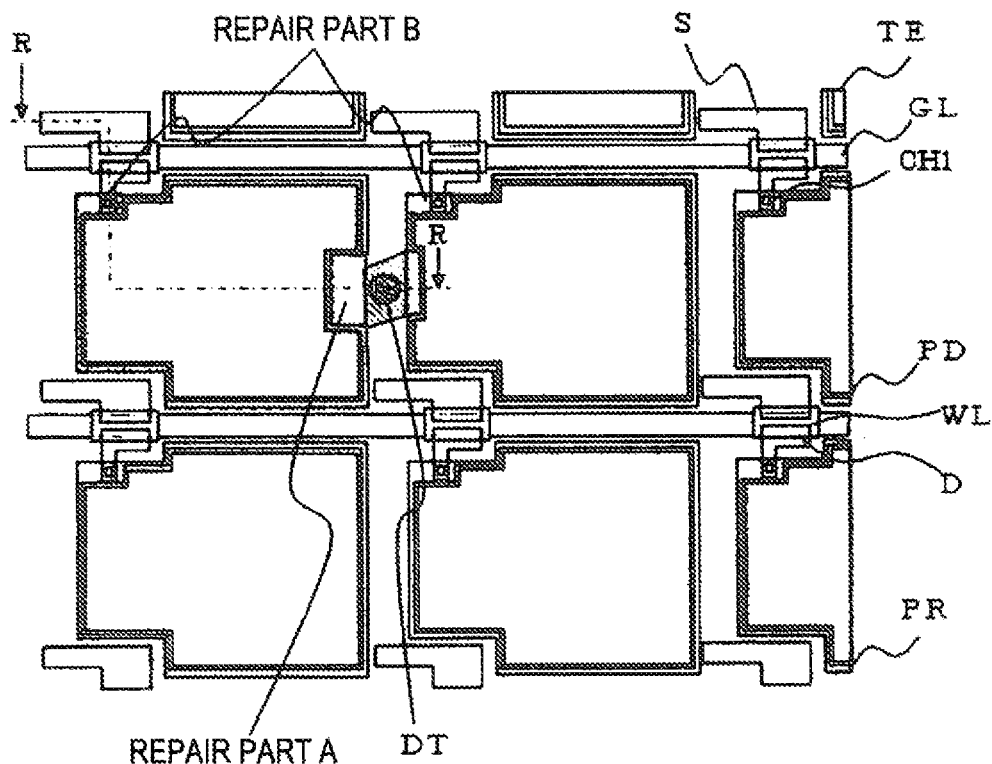
FIG. 19(a) and FIG. 19(b) illustrate the process of the method of manufacturing the array substrate according to the third illustrative embodiment.
Figure 19:
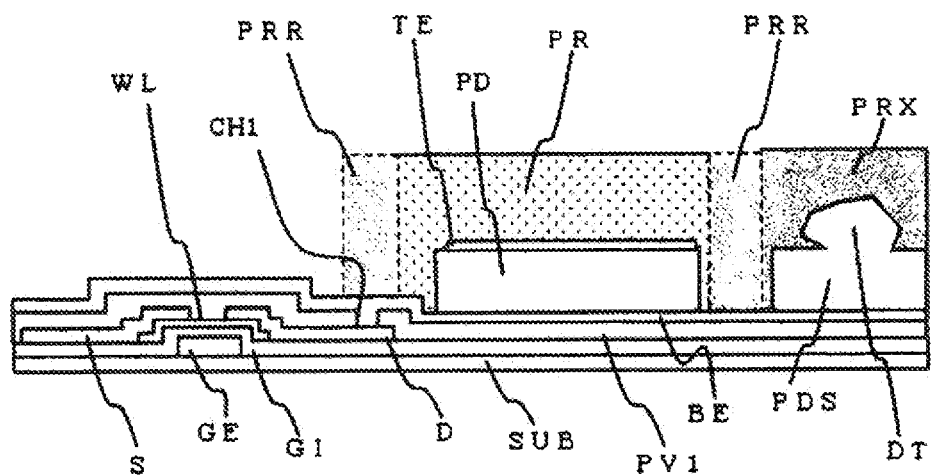

Next, the resist pattern PR for patterning the lower electrode BE is formed. In the pixel of the defect address, the resist PR in the area including the part from which the silicon film PDS of the photodiode has been removed and the contact hole CH1 is removed by the laser repair method and the like. This state is shown in FIG. 19(a) and FIG. 19(b) that is a sectional view taken along a line R-R of FIG. 19(a). The part shown with the dotted line indicates the resist pattern PRR that has been removed by the laser repair. In the normal pixel, in order to connect the lower electrode BE to the drain electrode D of the lower layer, the resist pattern PR is remained just above the contact hole CH1. However, it should be noted in the pixel of the defect address that the resist PR of the area including the contact hole CH1 is also removed by the laser repair.

Figure 20:
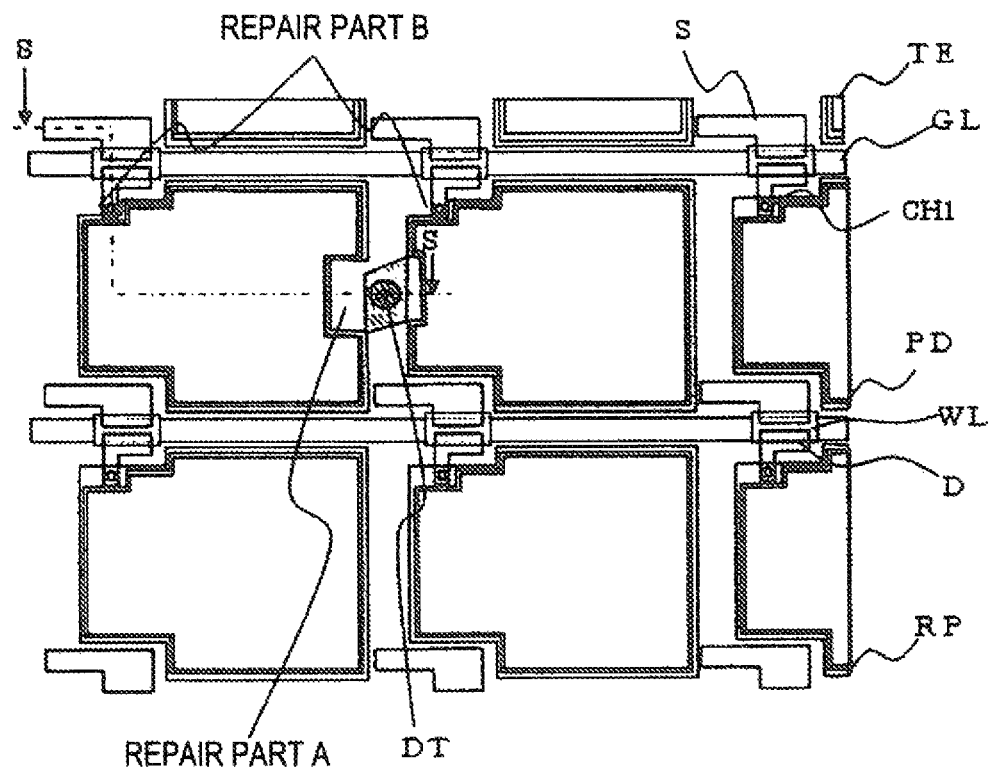
FIG. 20(a) and FIG. 20(b) illustrate the process of the method of manufacturing the array substrate according to the third illustrative embodiment.
Figure 20:
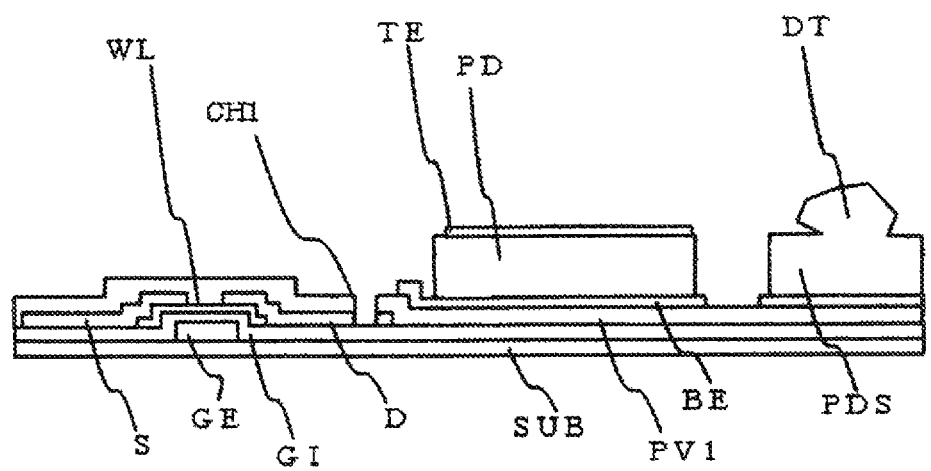

Next, the lower electrode BE is etched to remove the resist. This state is shown in FIG. 20(a) and FIG. 20(b) that is a sectional view taken along a line S-S of FIG. 20(a). The pattern of the foreign material DT in the silicon film PDS and the photodiode PD in the pixel are electrically completely isolated. Also, since the resist pattern PR on the contact hole CH1 has been removed, the photodiode PD in the pixel and the drain electrode D are also electrically completely isolated.

Unlike the second illustrative embodiment where the different-shaped photoelectric conversion element is made in the area including the contact hole CH2 connecting the data line and the source electrode, in the third illustrative embodiment, the different-shaped photoelectric conversion element is made in the area including any one of the data line, the photoelectric conversion element and between the photoelectric conversion element and the data line.

Also, even when it is difficult to remove the pattern defect caused by the foreign material DT in the silicon film PDS and the foreign material DT, the electric path between the drain electrode D and the photodiode PD via the contact hole CH1 and the electric path between the pattern defect and the photodiode are cut off. Thereby, even though the photodiode PD is damaged and the characteristic deterioration is thus accelerated for a long time of use, the corresponding defect is made to be a point defect in advance, so that a new point defect does not occur in an image after the correction. Hence, it is possible to provide the photoelectric conversion apparatus having high reliability.

Also, although it is not the repair for excluding the influence of the silicon damage, a repair of the line defect can be applied using the same method. The concept thereof is shown in FIG. 21(a) and FIG. 21(b) that is a sectional view taken along a line T-T of FIG. 21(a).

Figure 21:
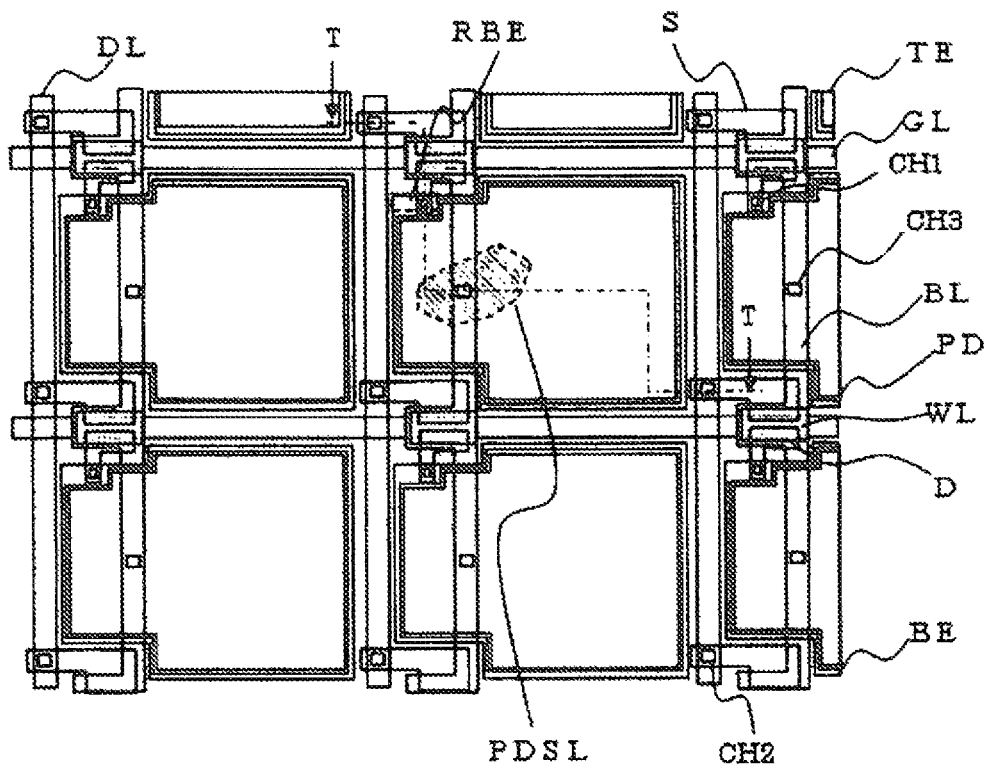
FIG. 21(a) and FIG. 21(b) illustrate a modified embodiment of the array substrate according to the third illustrative embodiment.
Figure 21:
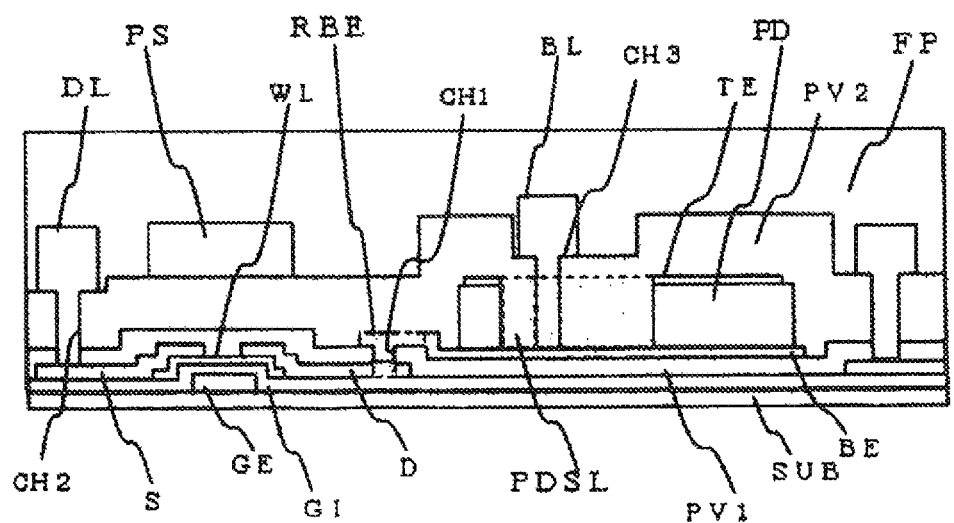

In FIG. 21(a), there is an area PDSL in which the silicon film PDS of the photodiode is missed. The silicon film PDS of the photodiode is missed in the contact hole CH3 connecting the upper electrode TE and the bias line BL, so that the bias line BL and the lower electrode BE are directly connected or low-resistance connected via the upper electrode TE. In the meantime, the lower electrode BE is removed from a repair part RBE in the area including the contact hole CH1 connecting with the drain electrode D. By this repair, it is possible to prevent the bias potential from being directly applied to the drain electrode D, thereby suppressing the line defect from occurring, which is caused due to a reading defect of an adjacent pixel signal by signal modification of the gate line GL.

In the meantime, the defect address is acquired by performing a defect inspection by the image recognition and the like upon the resist patterning of the lower electrode BE and registering a silicon missing pixel as a repair pixel. At the repair part, the laser repair of the drain electrode D may be performed, like the first illustrative embodiment.

Fourth Illustrative Embodiment

Figure 22:
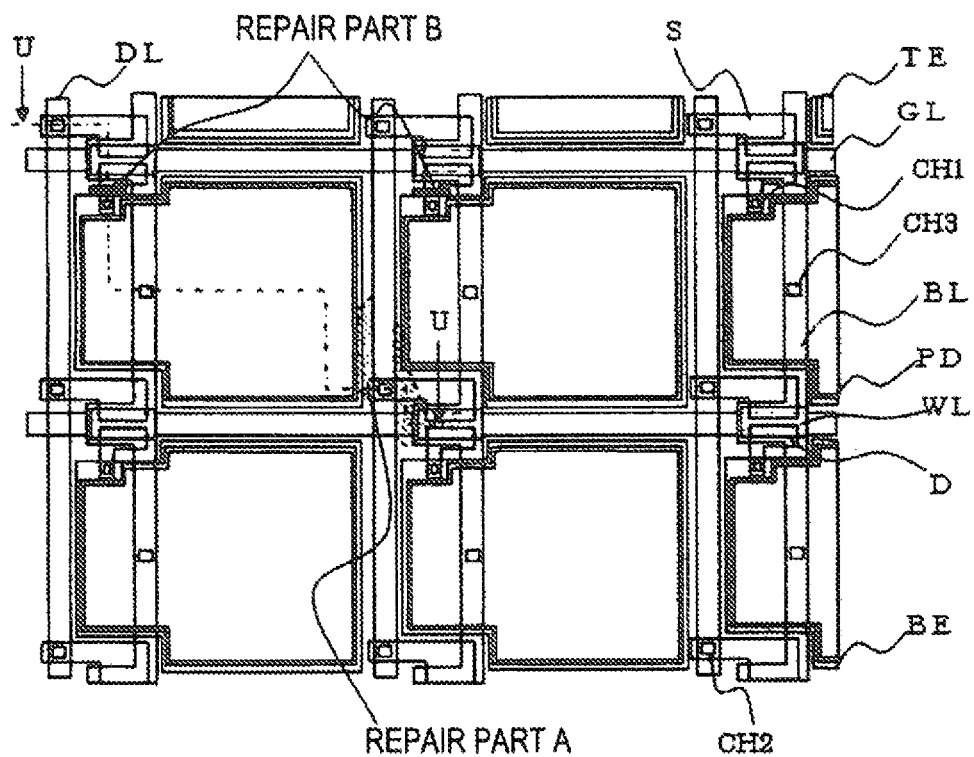
FIGS. 22(a) and 22(b) are a plan view and a sectional view of an array substrate according to a fourth illustrative embodiment.
Figure 22:
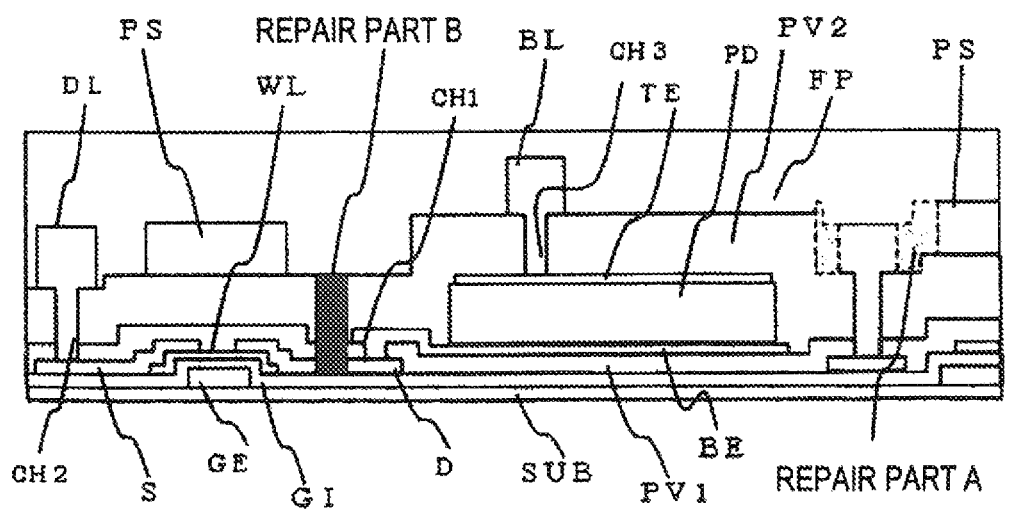

FIG. 22(a) and FIG. 22(b) that is a sectional view taken along a line U-U of FIG. 22(a) are a plan view and a sectional view of this illustrative embodiment.

The parts of the light shield film PS and the data line DL integrated with the bias line BL, which parts are connected by the pattern defect, are separated at the repair part A by the repair processing. In other words, at the repair part A, the adjacent data line or bias line is fixed to have a shape in which at least a part thereof is different from the normal data line or bias line, and the electrical connection of the photodiode PD and the data line DL is cut off at the repair part B as regards the transistor of the pixel extending over the area in which the adjacent data line or bias line is formed. Also, the repair for cutting off the electrical connection is performed at the repair part B of the drain electrode D of the pixel for which the repair processing has been made, more specifically at the repair part B between the semiconductor film SI and the contact hole CH1.

In other words, regarding the drain electrode of the pixel extending over the area in which the adjacent data line or bias line is formed, the drain electrode is cut so that a part, at which the corresponding drain electrode connects with the semiconductor layer, and a part, at which the corresponding drain electrode connects with the photoelectric conversion element, are separated from each other. By this repair processing, at the repair part B, the drain electrode D, the first interlayer insulation film PV1 and the second interlayer insulation film PV2 are removed and the electrical connection between the thin film transistor TR and the lower electrode BE is also cut off.

Also, like the drain electrode, regarding the source electrode, the source electrode may be cut so that a part, at which the corresponding source electrode connects with the semiconductor layer, and a part, at which the corresponding source electrode connects with the data line, are separated from each other. In the meantime, it has only to perform at least one of the repair for the source electrode and the repair for the drain electrode.

In the fourth illustrative embodiment, even though the photodiode PD is damaged and the characteristic deterioration is thus accelerated for a long time of use upon the repair processing for opening the short between the bias line BL and the data lien DL, the corresponding defect is made to be a point defect in advance, so that a new point defect does not occur in an image after the correction. Hence, it is possible to provide the photoelectric conversion apparatus having high reliability.

In the below, the manufacturing method is described. In the meantime, since the processes to the formation of the second interlayer insulation film PV2 are the same as those of the first illustrative embodiment, the descriptions thereof are omitted.

Figure 23:
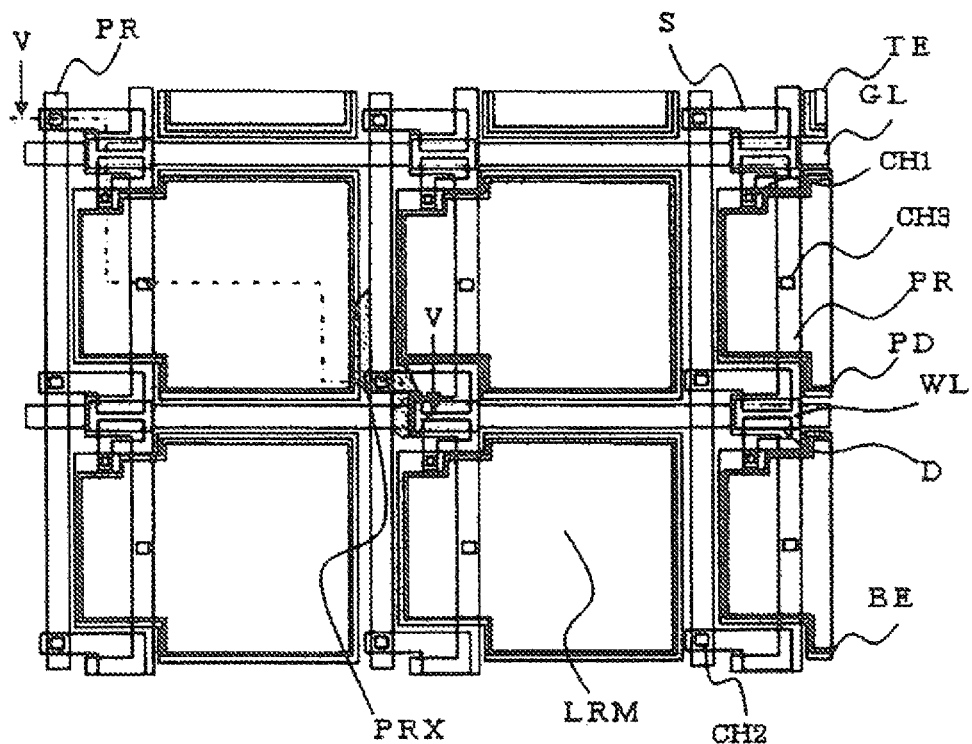
FIG. 23(a) and FIG. 23(b) illustrate a process of a method of manufacturing the array substrate according to the fourth illustrative embodiment.
Figure 23:
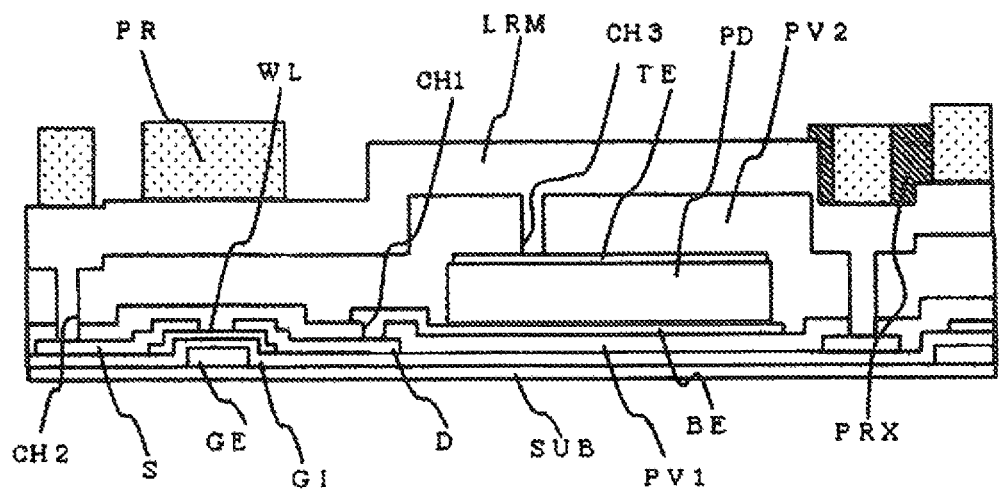

A low-resistance conductive film LRM forming the data line DL, the bias line BL and the light shield film PS is formed. Then, the resist pattern PR for forming the data line DL, the bias line BL and the light shield film PS is formed. Then, a defect inspection is performed by the image recognition and the like to thus register a pixel, in which the bias line BL and the data lien DL are shorted, as a repair pixel. This state is shown in FIG. 23(a) and FIG. 23(b) that is a sectional view taken along a line V-V of FIG. 23(a).

Figure 24:
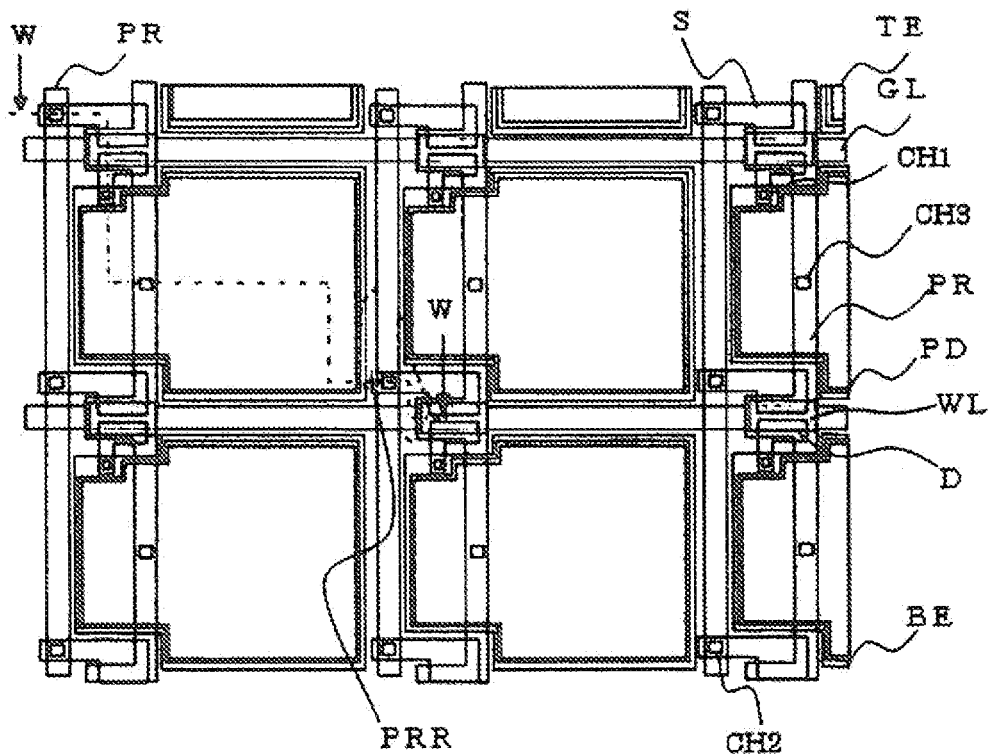
FIG. 24(a) and FIG. 24(b) illustrate the process of the method of manufacturing the array substrate according to the fourth illustrative embodiment.
Figure 24:
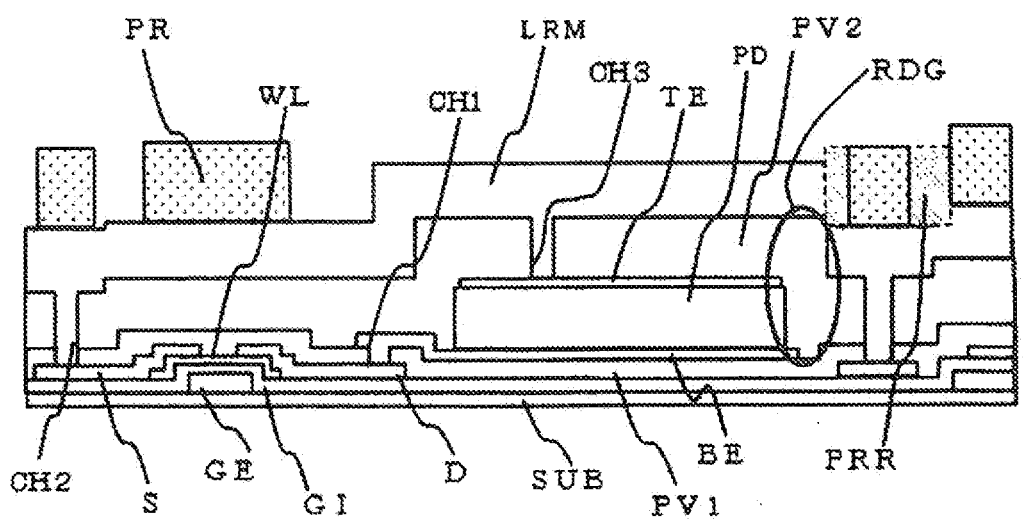

Next, the defect part PRX of the resist pattern of the registered address is removed by the laser repair and the like. This state is shown in FIG. 24(a) and FIG. 24(b) that is a sectional view taken along a line W-W of FIG. 24(a).

Next, the etching and peeling are performed to form the data line DL, the bias line BL and the light shield film PS. This state is shown in FIG. 25(a) and FIG. 25(b) that is a sectional view taken along a line X-X of FIG. 25(a).

Figure 26:
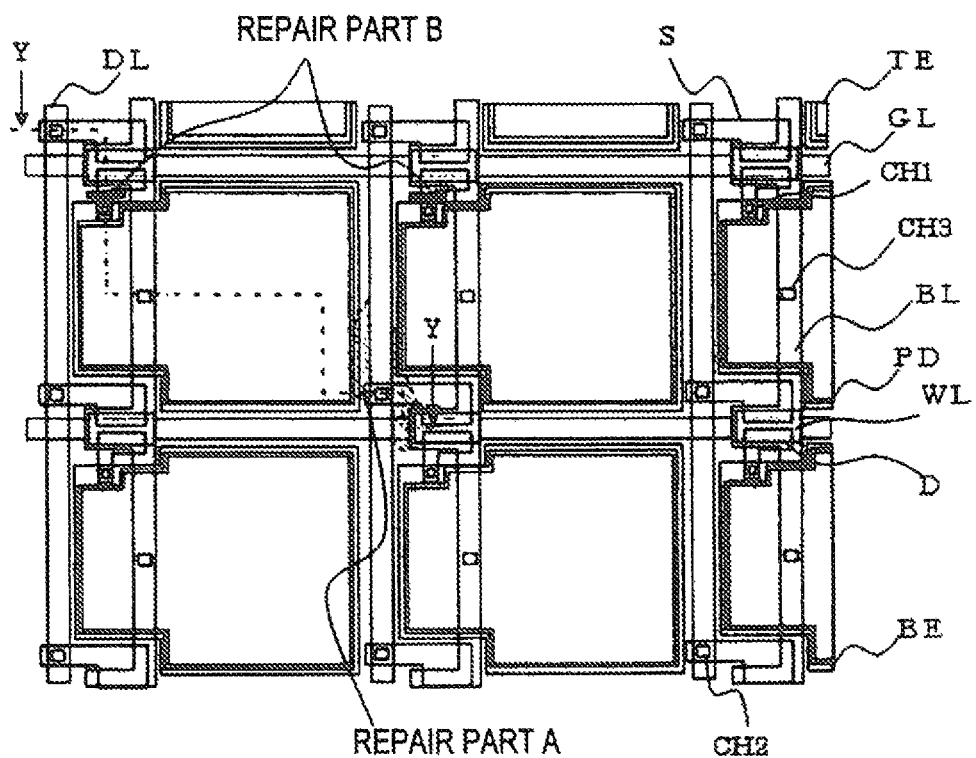
FIG. 26(a) and FIG. 26(b) illustrate the process of the method of manufacturing the array substrate according to the fourth illustrative embodiment.
Figure 26:
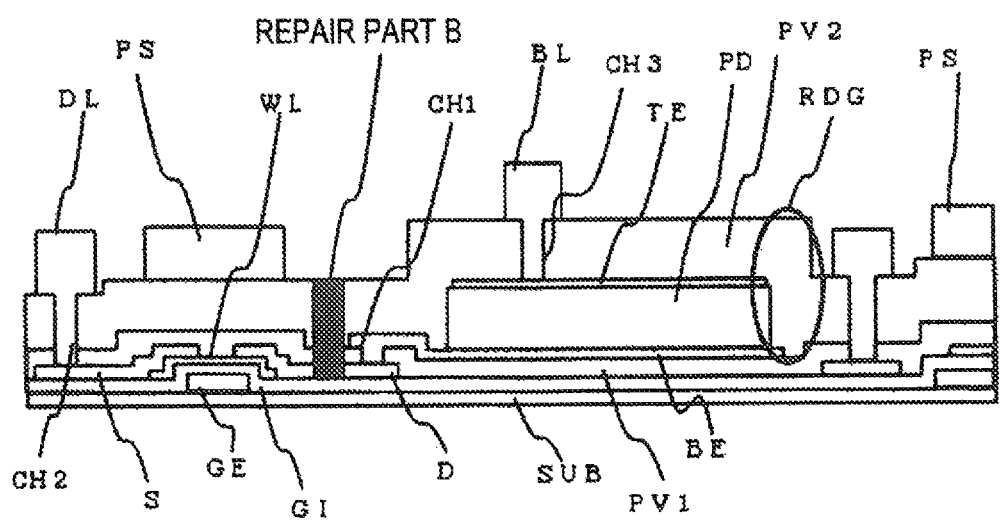

Next, the repair for cutting off the electrical connection is performed at the repair part B of the drain electrode D of the pixel for which the repair processing has been made at the defect registered address, more specifically at the repair part B between the semiconductor film SI and the contact hole CH1. A state where the disconnection by the laser repair as the repair is made is shown in FIG. 26(a) and FIG. 26(b) that is a sectional view taken along a line Y-Y of FIG. 26(a). Since the processes thereafter are the same as the above illustrative embodiment, the descriptions thereof are omitted.

In the meantime, regarding the repair sequence at the repair part A, the resist pattern is repaired and then the etching is performed. However, after the etching, the conductive film may be removed at the pattern defect part of the conductive film by the laser and the like.

Figure 25:
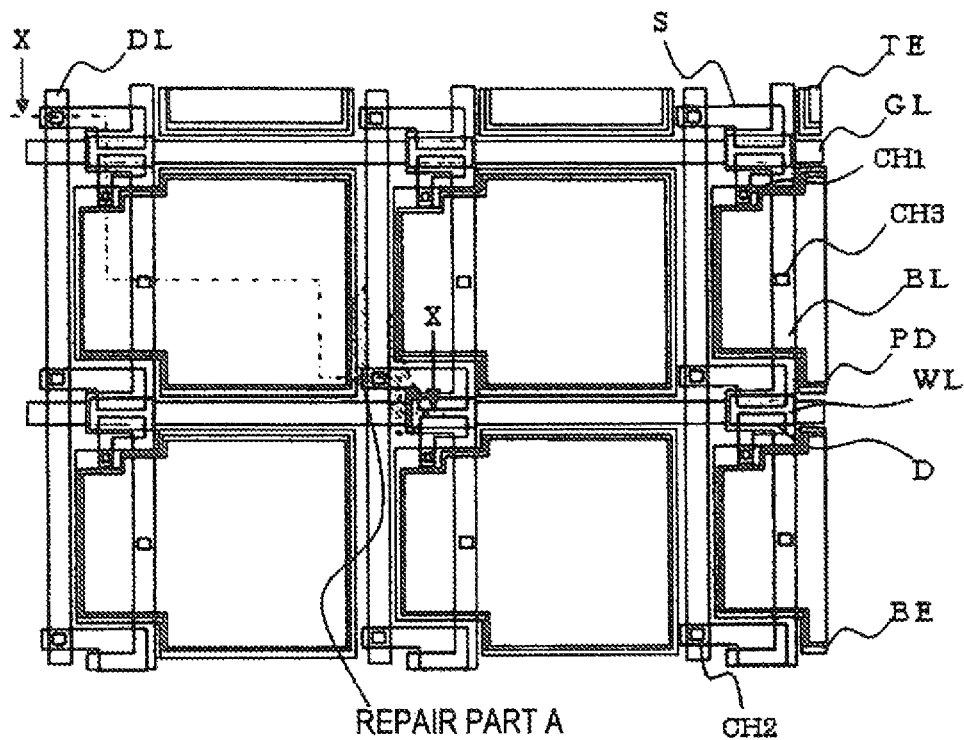
FIG. 25(a) and FIG. 25(b) illustrate the process of the method of manufacturing the array substrate according to the fourth illustrative embodiment.
Figure 25:
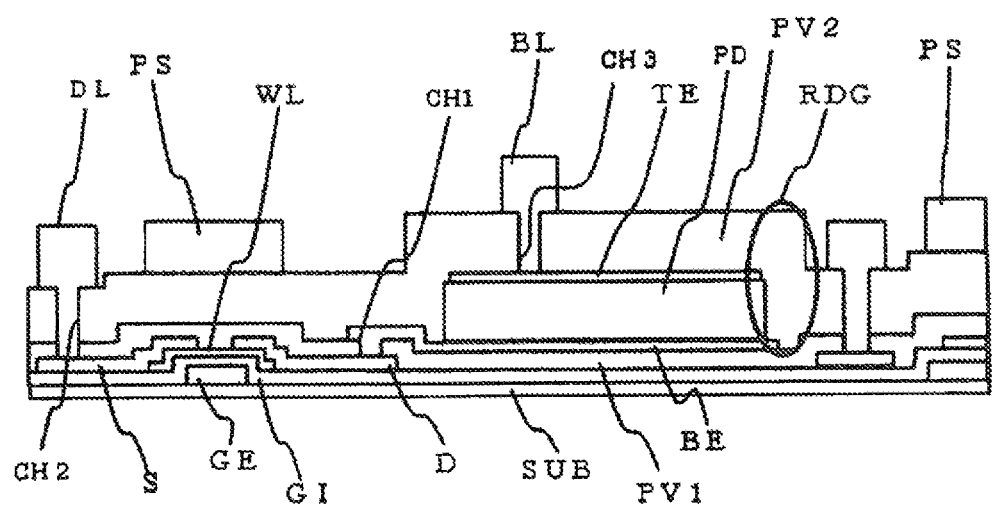

Also, the bias line BL shown in FIG. 25 is integrally formed with the light shield film PS. However, the bias line may be separated from the light shield film. Also in this case, when the data line DL and the bias line BL are shorted, the fourth illustrative embodiment can be applied.

Fifth Illustrative Embodiment

A plan view of this illustrative embodiment is shown in FIG. 27(a) and a sectional view taken along a line Z-Z of FIG. 27(a) is shown in FIG. 27(b).

In the first illustrative embodiment, the drain electrode D is electrically cut to open the electrical connection of the pixel and the data line DL. However, in this illustrative embodiment, it is a main object to open the electrical connection of the data line DL and the source electrode S. Specifically, in this illustrative embodiment, when there is a defect pixel including a shape defect photoelectric conversion element that has an abnormal shape, the contact hole CH2 of the corresponding defect pixel is not formed upon the formation of the second interlayer insulation film PV2, thereby making the electrical cutoff.

Figure 27:
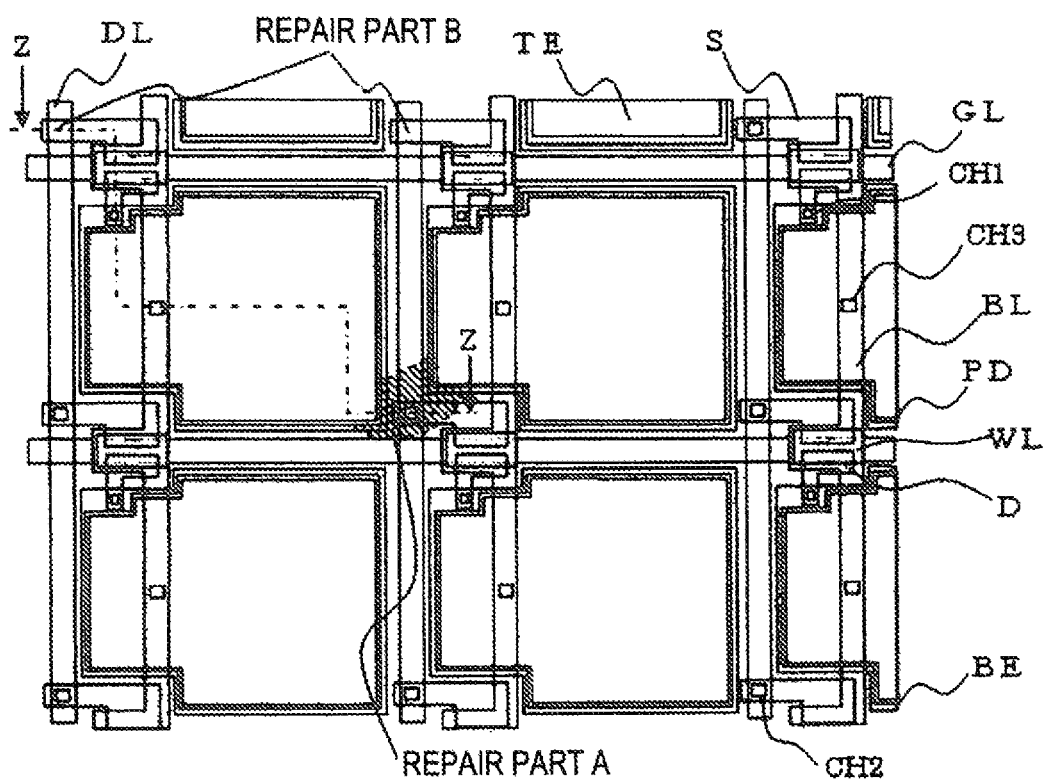
FIGS. 27(a) and 27(b) are a plan view and a sectional view of an array substrate according to a fifth illustrative embodiment.
Figure 27:
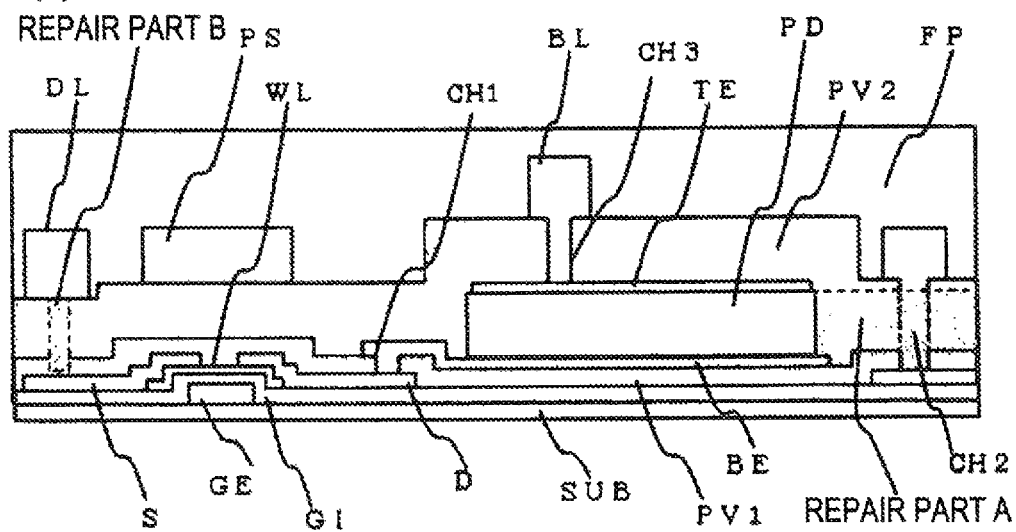
Figure 28:
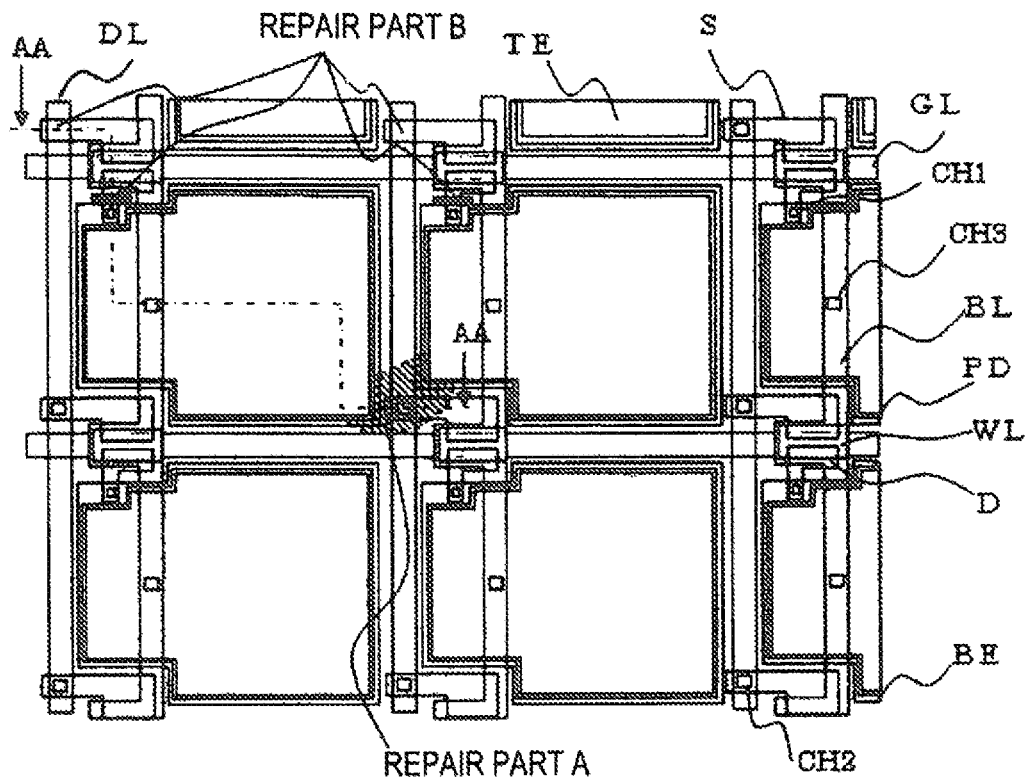
FIGS. 28(a) and 28(b) are a plan view and a sectional view of a modified embodiment of the array substrate according to the fifth illustrative embodiment.
Figure 28:
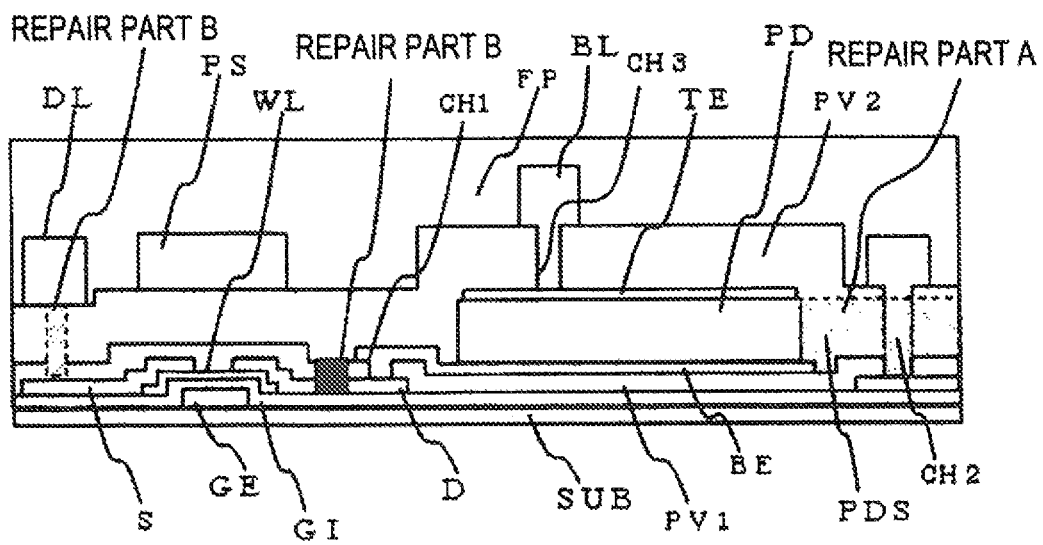

Meanwhile, in FIG. 27, only the repair of the contact hole CH2 is performed. However, the additional repair processing may be performed in the area of the drain electrode D. This state is shown in FIG. 28(*a*) that is a plan view and in FIG. 28(*b*) that is a sectional view taken along a line AA-AA of FIG. 28(*a*). When the repair is performed in the area of the drain electrode D, the pixel potential does not influence the gate line GL, so that it is possible to suppress the adjacent pixel in the gate direction from being detected as a pseudo defect.

Figure 29:
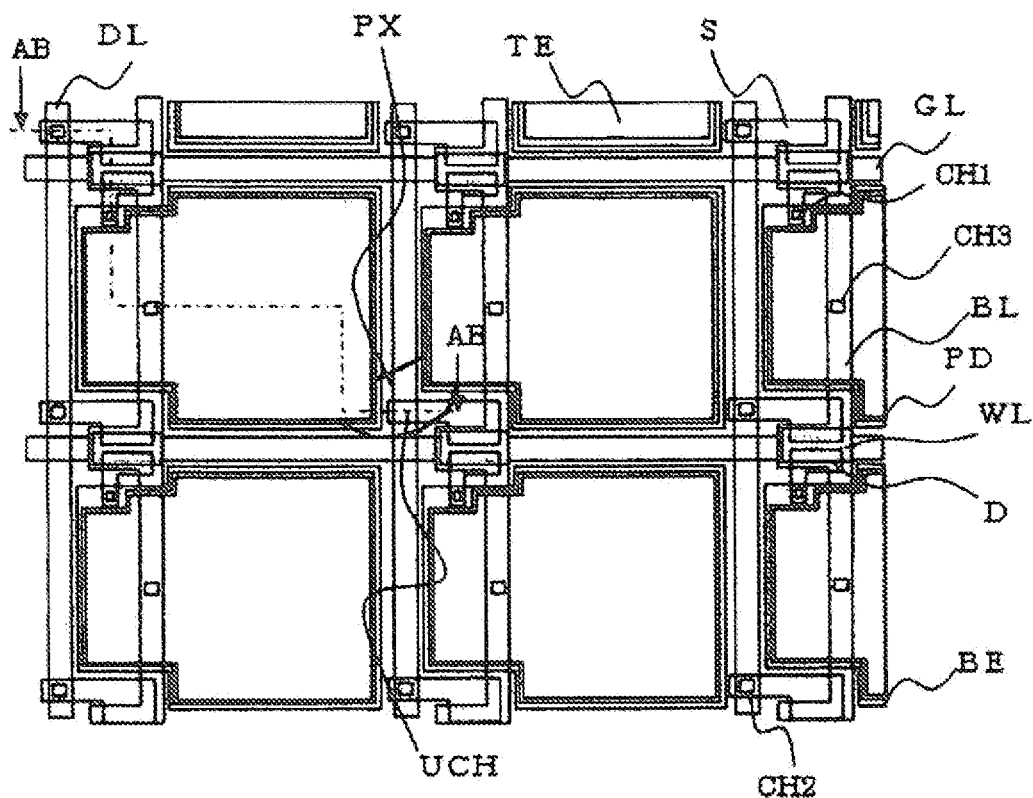
FIGS. 29(a) and 29(b) are a plan view and a sectional view of a modified embodiment of the array substrate according to the fifth illustrative embodiment.
Figure 29:
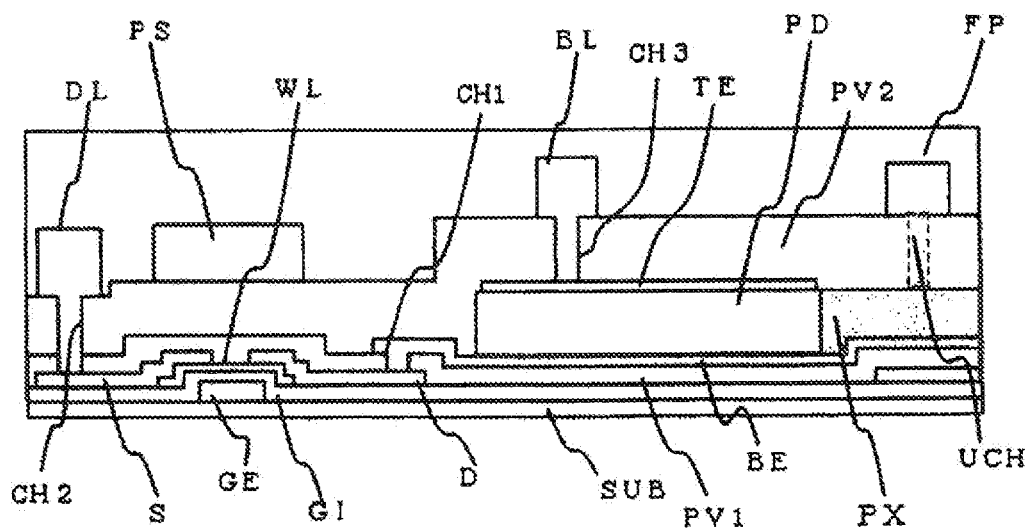

Also, when the pattern defect is not caused by the foreign material and the like in the silicon film PDS, the repair processing for the pattern defect part of the silicon film PDS configuring the photodiode is not performed between the adjacent photodiodes PD traversing the contact hole CH2. Instead of the repair of the pattern of the silicon film PDS, the second interlayer insulation film PV2 may be formed so that the contact hole CH2 of the corresponding pattern defect part is not formed. This state where such repair has been performed is shown in FIG. 29(*a*) that is a plan view and in FIG. 29(*b*) that is a sectional view taken along a line AB-AB of FIG. 29(*a*). In FIG. 29, the contact hole CH2 is not formed in a non-opening UCH.

Meanwhile, in FIG. 29, in the process of forming the photodiode PD in which the repair is not performed for the pattern defect part PX, the photodiode PD is not applied with the damage to be caused due to the repair processing. Thus, even when the electrical connection of the corresponding defect pixel and the data line DL is not repaired, the acceleration of the characteristic deterioration due to the temporal change is difficult to occur. However, the repair for the contact hole CH2 of the defect pixel or the same repair as shown in FIG. 27 or 28 may be performed in the area of the drain electrode D. At this time, since there are three point defects in the repair method of FIG. 29, it is preferable to determine the repair processing, considering the process load and the like.

In the below, a manufacturing method of FIG. 29 is described. In the meantime, since the processes to the detection of the pattern defect part PX of the silicon film PDS are the same as the first illustrative embodiment, the descriptions thereof are omitted.

After registering the defect address, the silicon film PDS is patterned without performing the repair. Then, the lower electrode BE is patterned.

Figure 30:
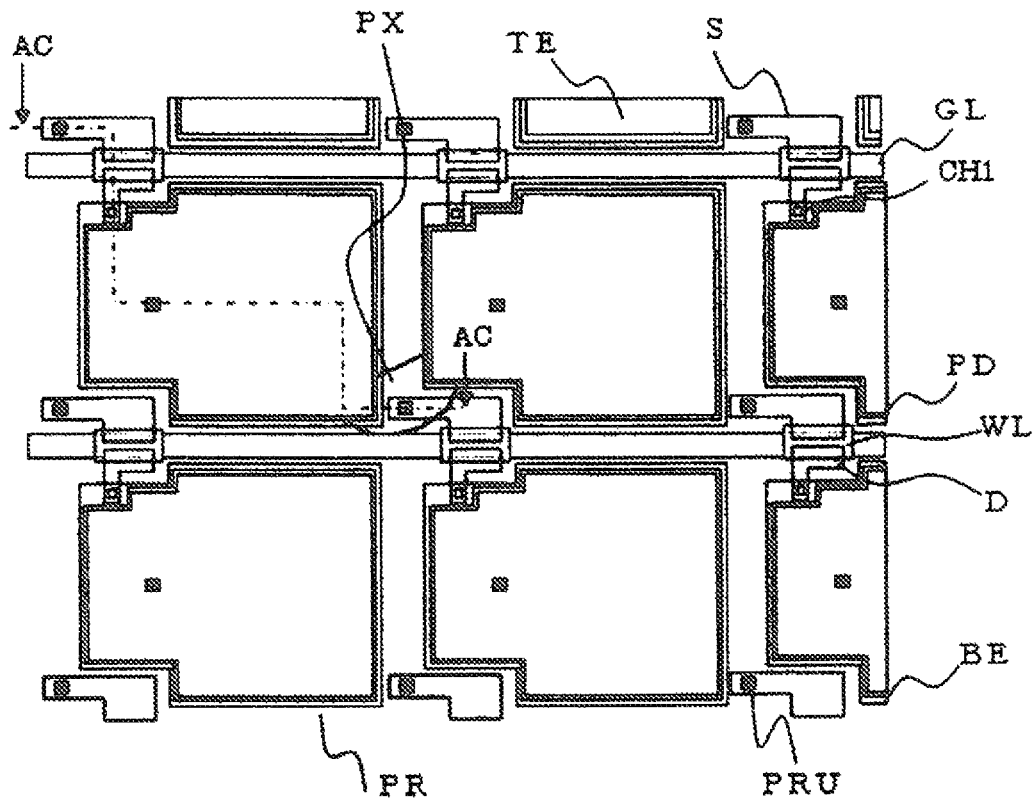
FIG. 30(a) and FIG. 30(b) illustrate a process of a method of manufacturing a modified embodiment of the array substrate according to the fifth illustrative embodiment.
Figure 30:
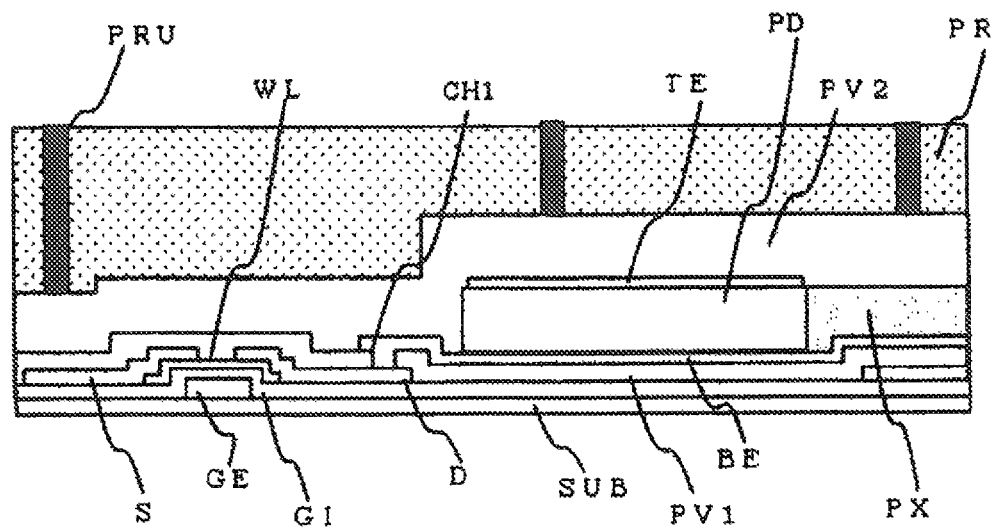

After that, the second interlayer insulation film PV2 is formed, a negative type resist is applied and an exposure is performed. This state is shown in FIG. 30(*a*) and FIG. 30(*b*) that is a sectional view taken along a line AC-AC of FIG. 30(*a*). In FIG. 30, the resist PR is applied over a whole surface. In the resist PR, the parts corresponding to the contact holes CH2, CH3 are non-exposed parts PRU that are not exposed.

Figure 31:
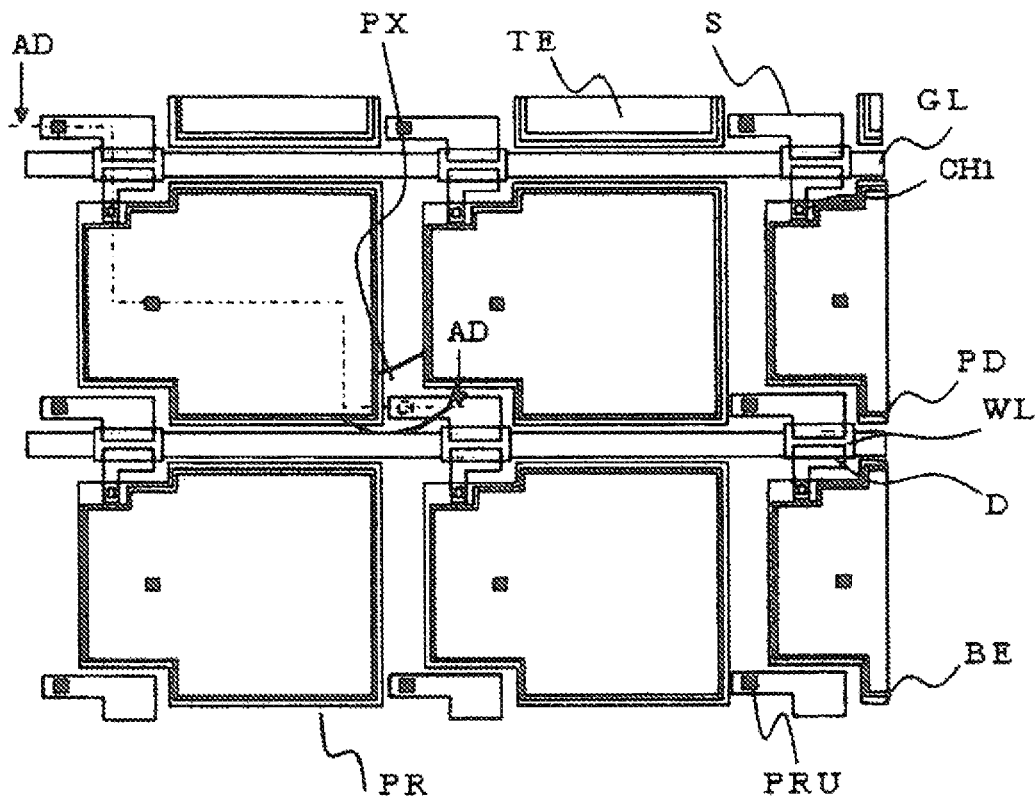
FIG. 31(a) and FIG. 31(b) illustrate the process of the method of manufacturing a modified embodiment of the array substrate according to the fifth illustrative embodiment.
Figure 31:
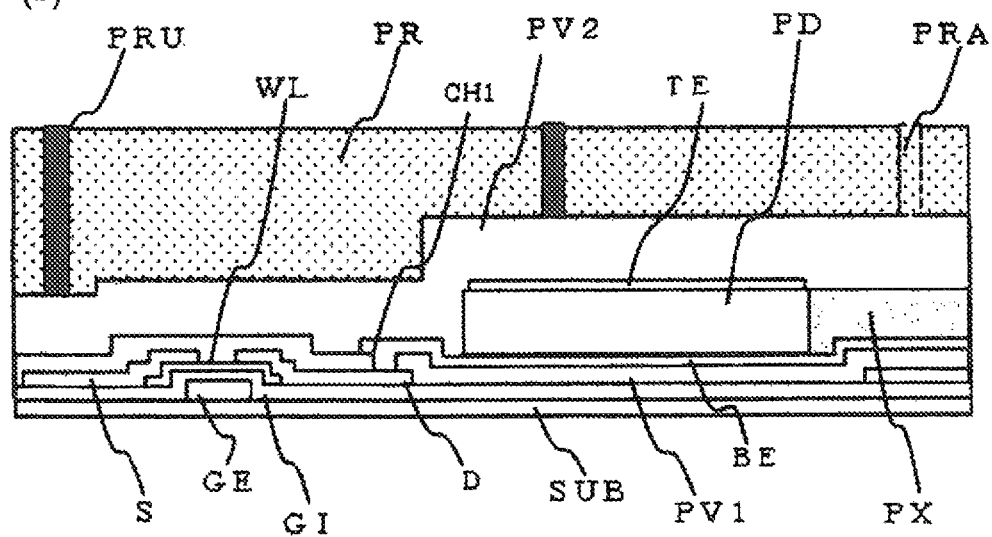

After that, a contact hole CH2 forming part of the address part of the defect traversing the contact hole CH2 is exposed in the pattern defect part PX of the silicon film PDS. This state is shown in FIG. 31(*a*) and FIG. 31(*b*) that is a sectional view taken along a line AD-AD of FIG. 31(*a*). Also in FIG. 31, the resist PR is formed over the whole surface, and the part corresponding to the contact hole CH2 adjacent to the pattern defect part PX is an additional exposed part PRA of the resist.

Figure 32:
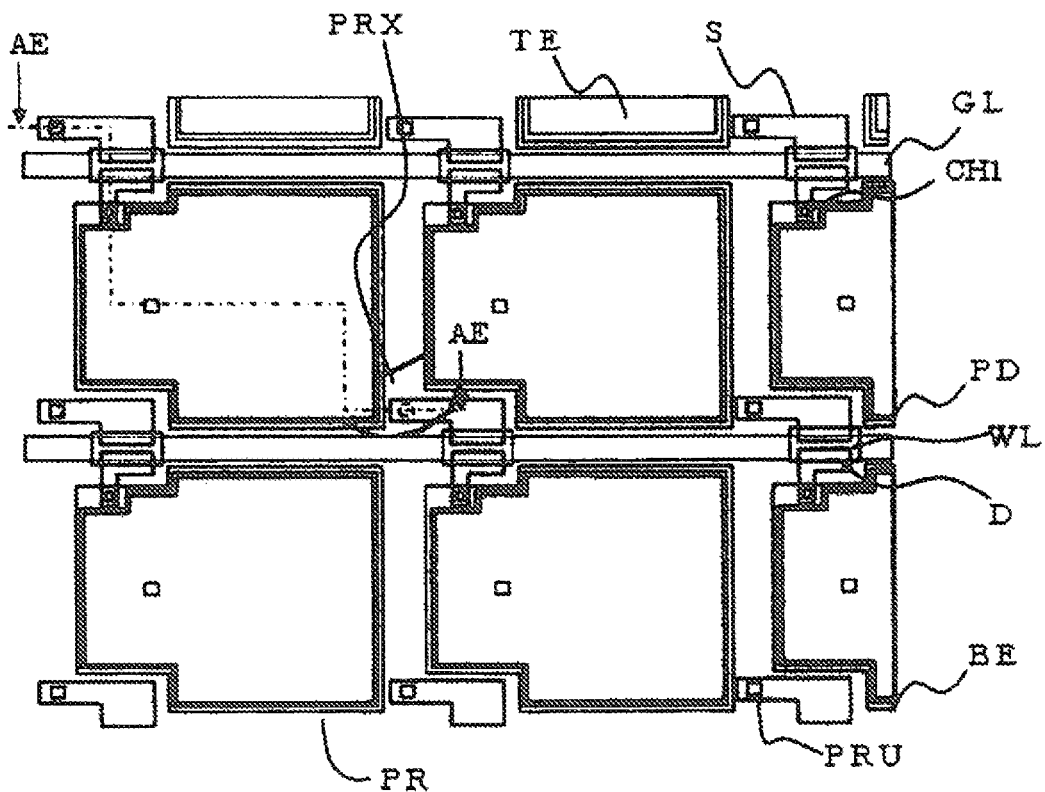
FIG. 32(a) and FIG. 32(b) illustrate the process of the method of manufacturing a modified embodiment of the array substrate according to the fifth illustrative embodiment.
Figure 32:
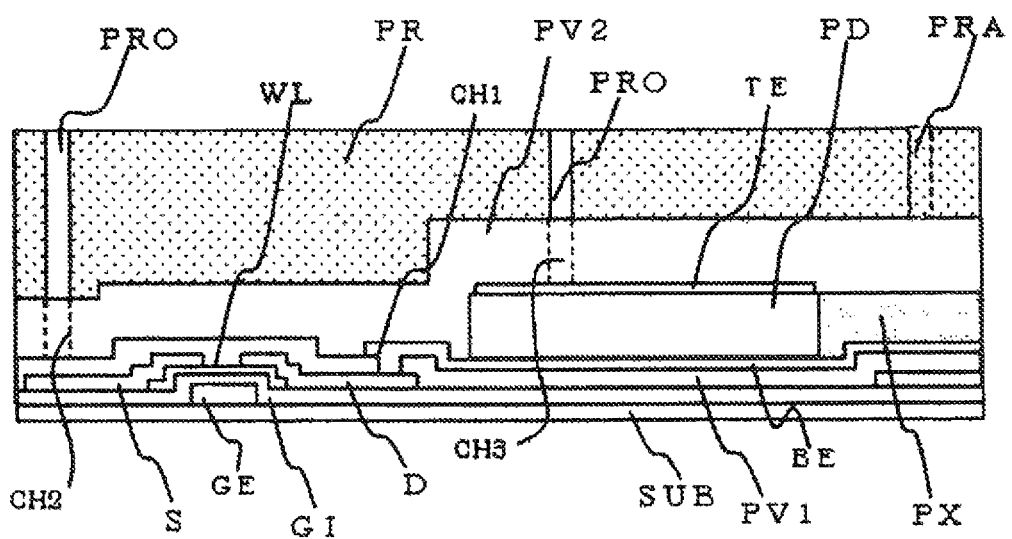

After that, developing processing is performed to form a resist pattern of an opening pattern of the second interlayer insulation film PV2. This state is shown in FIG. 32(*a*) and FIG. 32(*b*) that is a sectional view taken along a line AE-AE of FIG. 32(*a*). In FIG. 32, the opening pattern is not formed in the resist PR at the additionally exposed part PRA. Therefore, the contact hole CH2 is not opened even by the etching that is subsequently performed, so that the electrical path is cut off. That is, the data line DL and the shape defect photoelectric conversion element, which overlap each other in the contact hole CH2 connecting the data line DL and the source electrode S when seen from a plan view, are not electrically connected to each other.

On the other hand, since an opening PRO is provided in the resist PR at the part corresponding to the contact hole CH2 or CH3 of the normal pixel, the contact holes CH2, CH3, which are shown with the dotted lines in FIG. 32(*b*), are opened by the etching that is subsequently performed. Since the processes thereafter are the same as the above illustrative embodiment, the descriptions thereof are omitted.

Meanwhile, in the above manufacturing method, the repair method for the contact hole CH2 using the negative-type resist has been exemplified. However, a method may be also used in which the opening of the contact hole CH2 is not formed by using a method of performing the pattering with a positive-type resist and then lowering the viscosity of the resist in the corresponding contact hole to thus plug the opening, for example.

Also, in this illustrative embodiment, the opening of the contact hole CH2 is not formed. However, as regards the method of cutting off the electrical connection of the data line DL and the source electrode S, when the data line DL on the contact hole CH2 is removed, the same effects can be obtained. Furthermore, when the data can be read out from both sides, the data line DL may be cut in the vicinity of the corresponding contact hole CH2. That is, since the data line DL is not formed in the contact hole CH2, which is provided so as to connect the data line DL and the source electrode S overlapping with each other when seen from a plan view, the electrical connection is not made.

What is claimed is:

1. A photoelectric conversion apparatus comprising:
   an active matrix-type TFT array substrate on which photoelectric conversion elements and thin film transistors are arranged in a matrix shape,
   wherein the thin film transistor includes: a plurality of gate lines having a gate electrode; a semiconductor layer provided to the gate electrode via a gate insulation film; and a source electrode and a drain electrode which are connected to the semiconductor layer,
   wherein the photoelectric conversion element connects with the drain electrode via a contact hole opened through a first interlayer insulation film provided above the thin film transistor,
   wherein a data line and a bias line are formed on a second interlayer insulation film provided above the photoelectric conversion element and are connected with the source electrode and the photoelectric conversion element via respective contact holes opened through the second interlayer insulation, and
   wherein at least a part of the photoelectric conversion element is fixed to have a shape different from a normal pixel between pixels adjacent to each other in an extending direction of the gate line, and an electrical connection between the photoelectric conversion element and the data line is cut off in the transistor of the pixel having the different shape.

2. The photoelectric conversion apparatus according to claim 1, wherein, in an area including a contact hole connecting the data line and the source electrode, the different-shaped photoelectric conversion element is fixed to have the different shape.

3. The photoelectric conversion apparatus according to claim 1,
wherein, in an area including at least one of the data line, a portion between the data line and the photoelectric conversion element, and the photoelectric conversion element, the different-shaped photoelectric conversion element is fixed to have the different shape.

4. The photoelectric conversion apparatus according to claim 1,
wherein, in the pixel fixed to have the different-shaped photoelectric conversion element, the drain electrode is cut so that a part, at which the drain electrode connects with the semiconductor layer, and a part, at which the drain electrode connects with the photoelectric conversion element, are separated from each other.

5. The photoelectric conversion apparatus according to claim 1,
wherein, in the pixel fixed to have the different-shaped photoelectric conversion element, the source electrode is cut so that a part, at which the source electrode connects with the semiconductor layer, and a part, at which the source electrode connects with the data line, are separated from each other.

6. The photoelectric conversion apparatus according to claim 1,
wherein, in the pixel fixed to have the different-shaped photoelectric conversion element, at least a lower electrode pattern of the photoelectric conversion element is removed in an area including a connection opening of the drain electrode and the photoelectric conversion element.

7. The photoelectric conversion apparatus according to claim 1,
wherein, in the pixel fixed to have the different-shaped photoelectric conversion element, the data line and the source electrode are not electrically connected to each other.

8. A photoelectric conversion apparatus comprising
an active matrix-type TFT array substrate on which photoelectric conversion elements and thin film transistors are arranged in a matrix shape,
wherein the thin film transistor includes: a plurality of gate lines having a gate electrode; a semiconductor layer provided to the gate electrode via a gate insulation film; and a source electrode and a drain electrode which are connected to the semiconductor layer,
wherein the photoelectric conversion element connects with the drain electrode via a contact hole opened through a first interlayer insulation film provided above the thin film transistor,
wherein a data line and a bias line are formed on a second interlayer insulation film provided above the photoelectric conversion element and are connected with the source electrode and the photoelectric conversion element via respective contact holes opened through the second interlayer insulation,
wherein at least one photoelectric conversion element is a shape defect photoelectric conversion element that has an abnormal shape, and
wherein, in the contact hole of the second interlayer insulation film, the data line and the shape defect photoelectric conversion element, which are overlapped with each other when seen from a plan view, are not electrically connected to each other.

9. The photoelectric conversion apparatus according to claim 8,
wherein, in the contact hole of the second interlayer insulation film, an opening of the contact hole, in which the data line and the shape defect photoelectric conversion element are overlapped with each other when seen from a plan view, is not formed.

10. The photoelectric conversion apparatus according to claim 8,
wherein, in the contact hole of the second interlayer insulation film, the data line is not formed at least in the contact hole, in which the data line and the shape defect photoelectric conversion element are overlapped with each other when seen from a plan view.

11. A photoelectric conversion apparatus comprising
an active matrix-type TFT array substrate on which photoelectric conversion elements and thin film transistors are arranged in a matrix shape,
wherein the thin film transistor includes: a plurality of gate lines having a gate electrode; a semiconductor layer provided to the gate electrode via a gate insulation film; and a source electrode and a drain electrode connected to the semiconductor layer,
wherein the photoelectric conversion element connects with the drain electrode via a contact hole opened through a first interlayer insulation film provided above the thin film transistor,
wherein a data line and a bias line are formed on a second interlayer insulation film provided above the photoelectric conversion element and are connected with the source electrode and the photoelectric conversion element via respective contact holes opened through the second interlayer insulation, and
wherein shapes of at least a part of the data line and the bias line adjacent to each other are fixed to have a shape different from that of normal data line and bias line, and an electrical connection between the photoelectric conversion element and the data line is cut off in the transistor of a pixel extending over an area in which the shapes of the data line and the bias line adjacent to each other are fixed.

12. The photoelectric conversion apparatus according to claim 11,
wherein, in the drain electrode of the pixel fixed to have the different-shaped data line and bias line, the drain electrode is cut so that a part, at which the drain electrode connects with the semiconductor layer, and a part, at which the drain electrode connects with the photoelectric conversion element, are separated from each other.

13. The photoelectric conversion apparatus according to claim 11,
wherein, in the source electrode of the pixel fixed to have the different-shaped data line and bias line, the source electrode is cut so that a part, at which the source electrode connects with the semiconductor layer, and a part, at which the source electrode connects with the data line, are separated from each other.

* * * * *